United States Patent
Shimizu et al.

(10) Patent No.: US 10,424,640 B2
(45) Date of Patent: Sep. 24, 2019

(54) SEMICONDUCTOR DEVICE AND METHOD OF MANUFACTURING THE SAME

(71) Applicant: Kabushiki Kaisha Toshiba, Minato-ku (JP)

(72) Inventors: Tatsuo Shimizu, Shinagawa (JP); Ryosuke Iijima, Setagaya (JP); Johji Nishio, Machida (JP); Teruyuki Ohashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/813,692

(22) Filed: Jul. 30, 2015

(65) Prior Publication Data

US 2016/0087036 A1 Mar. 24, 2016

(30) Foreign Application Priority Data

Sep. 19, 2014 (JP) ................................. 2014-190930

(51) Int. Cl.
*H01L 29/08* (2006.01)
*H01L 21/04* (2006.01)
(Continued)

(52) U.S. Cl.
CPC ...... *H01L 29/086* (2013.01); *H01L 21/02554* (2013.01); *H01L 21/02694* (2013.01);
(Continued)

(58) Field of Classification Search
CPC ... H01L 29/08; H01L 29/086; H01L 29/7801; H01L 29/868; H01L 29/401; H01L 29/43;
(Continued)

(56) References Cited

U.S. PATENT DOCUMENTS 6,214,107 B1 4/2001 Kitabatake
6,423,986 B1 * 7/2002 Zhao ....................... H01L 29/16
257/110
(Continued)

FOREIGN PATENT DOCUMENTS

JP H 08-8210 A 1/1996
JP 08-064802 A 3/1996
(Continued)

OTHER PUBLICATIONS

U.S. Appl. No. 14/751,567, filed Jun. 26, 2015, Tatsuo Shimizu.
(Continued)

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

A semiconductor device according to an embodiment includes a SiC layer, an electrode electrically connected to the SiC layer and an impurity region provided between the SiC layer and the electrode. The impurity region includes first position and second position, the first position having highest concentration of an impurity in the impurity region, the highest concentration being not lower than $1 \times 10^{20}$ cm$^{-3}$ and not higher than $5 \times 10^{22}$ cm$^{-3}$, the second position having concentration of the impurity one digit lower than the highest concentration, the first position being between the electrode and the second position, a distance between the first position and the second position being 50 nm or shorter.

11 Claims, 22 Drawing Sheets

(51) Int. Cl.
*H01L 29/66* (2006.01)
*H01L 21/02* (2006.01)
*H01L 21/225* (2006.01)
*H01L 29/40* (2006.01)
*H01L 29/43* (2006.01)
*H01L 29/78* (2006.01)
*H01L 29/868* (2006.01)

(52) U.S. Cl.
CPC ........ *H01L 21/046* (2013.01); *H01L 21/0485* (2013.01); *H01L 21/2253* (2013.01); *H01L 29/08* (2013.01); *H01L 29/401* (2013.01); *H01L 29/43* (2013.01); *H01L 29/66015* (2013.01); *H01L 29/7801* (2013.01); *H01L 29/868* (2013.01)

(58) Field of Classification Search
CPC ......... H01L 21/02694; H01L 21/02554; H01L 21/2253
See application file for complete search history.

(56) References Cited

U.S. PATENT DOCUMENTS

| | | |
|---|---|---|
| 8,367,507 B1 | 2/2013 | Tsuchiya et al. |
| 2010/0055858 A1* | 3/2010 | Hayashi ............... H01L 29/45 438/285 |
| 2011/0175111 A1* | 7/2011 | Harada ............ H01L 29/66068 257/77 |
| 2013/0328062 A1 | 12/2013 | Hisamoto et al. |
| 2014/0183561 A1 | 7/2014 | Shimizu |
| 2016/0087043 A1 | 3/2016 | Shimizu |
| 2016/0087045 A1 | 3/2016 | Shimizu |

FOREIGN PATENT DOCUMENTS

| | | |
|---|---|---|
| JP | 2003-168653 A | 6/2003 |
| JP | 2007-141950 | 6/2007 |
| JP | 2009-266871 | 11/2009 |
| JP | 2010-103229 A | 5/2010 |
| JP | 2013-58602 | 3/2013 |
| JP | 2013-254842 | 12/2013 |
| JP | 2014-127709 A | 7/2014 |
| JP | 2016-63110 A | 4/2016 |
| JP | 2016-63111 A | 4/2016 |
| WO | WO 97/39476 | 10/1997 |
| WO | WO 2010/134344 A1 | 11/2010 |
| WO | WO 2012/032735 A1 | 3/2012 |

OTHER PUBLICATIONS

Extended European Search Report dated Feb. 11, 2016 in Patent Application No. 15176911.4.

Siddarth G. Sundaresan, et al., "Ultra-low resistivity $Al^+$ implanted 4H-SiC obtained by microwave annealing and a protective graphite cap" Solid-State Electronics, vol. 52, XP022360431, 2008, pp. 140-145.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-190930, filed on Sep. 19, 2014, the entire contents of which are incorporated herein by reference.

FIELD

Embodiments described herein relate generally to a semiconductor device and a method of manufacturing the same.

BACKGROUND

SiC (silicon carbide) is expected to be a material for next-generation semiconductor devices. SiC has excellent physical properties, having a band gap three times wider than that of Si (silicon), a breakdown field strength approximately 10 times higher than that of Si, and a heat conductivity approximately three times higher than that of Si. A semiconductor device that has low loss and is capable of high-temperature operation can be realized by taking advantage of those properties.

However, a semiconductor device using SiC has the problem of having a high contact resistance between a SiC layer and a contact electrode. The contact resistance is high, supposedly because the concentration and the activation rate of the impurity in the SiC are low.

DETAILED DESCRIPTION

Figure 1:
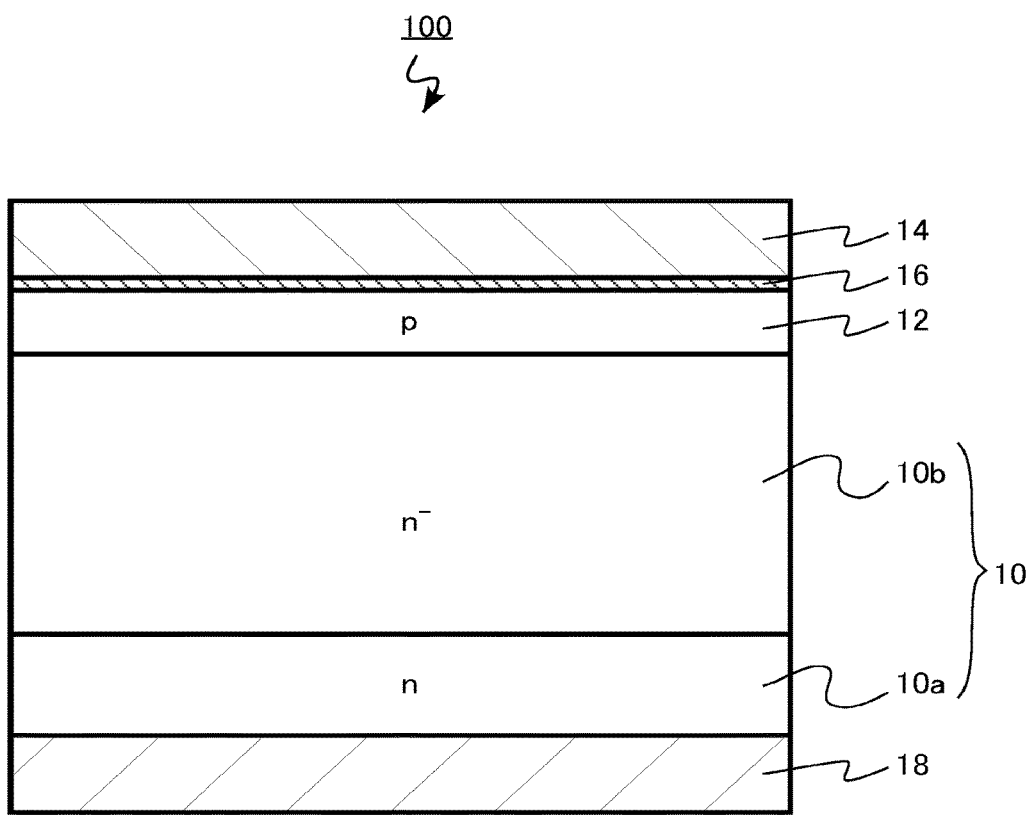
FIG. 1 is a schematic cross-sectional view of a semiconductor device according to a first embodiment.

A semiconductor device according to an embodiment includes: a SiC layer; an electrode electrically connected to the SiC layer; and an impurity region provided between the SiC layer and the electrode, the impurity region including first position and second position, the first position having highest concentration of an impurity in the impurity region, the highest concentration being not lower than $1 \times 10^{20}$ cm$^{-3}$ and not higher than $5 \times 10^{22}$ cm$^{-3}$, the second position having concentration of the impurity one digit lower than the highest concentration, the first position being between the electrode and the second position, a distance between the first position and the second position being 50 nm or shorter.

The following is a description of embodiments, with reference to the accompanying drawings. In the description below, same or similar components are denoted by same reference numerals, and explanation of components described once will not be repeated.

In the description below, $n^+$, n, $n^-$, $p^+$, p, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$-type and an $n^-$-type are referred to simply as an n-type, and a $p^+$-type and a $p^-$-type are referred to simply as a p-type.

In this specification, a "projected range" means the position of the peak concentration of an impurity introduced from the surface of a SiC layer through ion implantation. A "projected range" can be controlled by adjusting the conditions for ion implantation.

First Embodiment

A semiconductor device according to an embodiment includes: a SiC layer; an electrode electrically connected to the SiC layer; and an impurity region provided between the SiC layer and the electrode, the highest concentration of the impurity being not lower than $1\times10^{20}$ cm$^{-3}$ and not higher than $5\times10^{22}$ cm$^{-3}$, the distance between the position (first position) where the concentration of the impurity becomes highest and the position (second position) where the concentration of the impurity becomes one digit lower than the highest concentration on the SiC layer side of the position of the highest concentration being 50 nm or shorter.

FIG. 1 is a schematic cross-sectional view of the structure of a PIN diode that is a semiconductor device according to this embodiment.

This PIN diode 100 includes a SiC substrate 10. The SiC substrate 10 is formed with an n-type SiC layer 10a and an $n^-$-type SiC drift layer 10b on the n-type SiC layer 10a.

The SiC layer 10a includes first and second planes. In FIG. 1, the first plane is the upper surface, and the second plane is the lower surface. The SiC layer 10a is the SiC of 4H—SiC containing N (nitrogen), for example, as the n-type impurity at an impurity concentration not lower than $1\times10^{18}$ cm$^{-3}$ and not higher than $1\times10^{20}$ cm$^{-3}$, for example.

Figure 2:
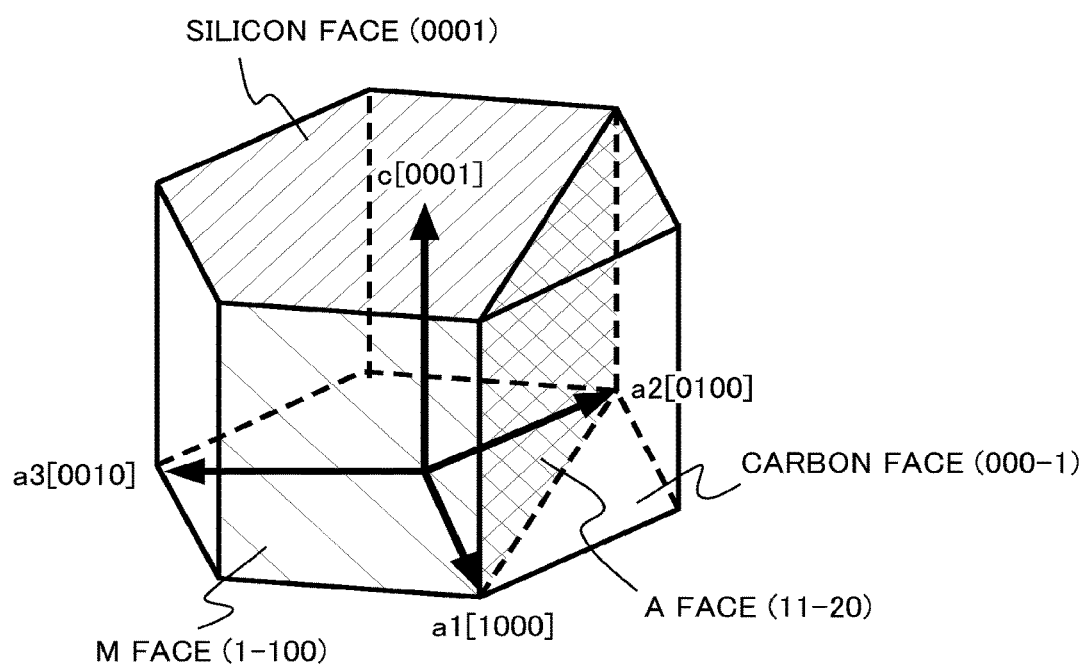
FIG. 2 is a diagram showing a crystalline structure of a SiC semiconductor according to the first embodiment.

FIG. 2 is a diagram showing a crystalline structure of a SiC semiconductor. A typical crystalline structure of a SiC semiconductor is a hexagonal crystal system such as 4H—SiC. One of the faces (the top faces of a hexagonal prism) having the c-axis extending in the axial direction of the hexagonal prism as the normal line is the (0001) face. The face equivalent to the (0001) face is referred to as the silicon face and is written as the {0001} face. Si (silicon) is arranged in the silicon face.

The other one of the faces (the top faces of the hexagonal prism) having the c-axis extending in the axial direction of the hexagonal prism as the normal line is the (000-1) face. The face equivalent to the (000-1) face is referred to as the carbon face and is written as the {000-1} face. C (carbon) is arranged in the carbon face.

Meanwhile, aside face (prismatic face) of the hexagonal prism is an M face equivalent to the (1-100) face, or is the {1-100} face. The face extending along edge lines that are not adjacent to each other is an A face equivalent to the (11-20) face, or is the {11-20} face. Both Si (silicon) atoms and C (carbon) atoms are arranged in the M face and the A face.

The description below concerns an example case where the first plane of the SiC layer 10a is a face tilted at zero to eight degrees to the silicon face, and the second plane is a face tilted at zero to eight degrees to the carbon face. The face tilted at zero to eight degrees to the silicon face, and the face tilted at zero to eight degrees to the carbon face can be regarded substantially equivalent to the silicon face and the carbon face, respectively, in terms of characteristics.

The drift layer 10b is an epitaxially grown layer of SiC formed on the SiC layer 10a through epitaxial growth, for example. The concentration of the n-type impurity in the drift layer 10b is not lower than $5\times10^{15}$ cm$^{-3}$ and not higher than $2\times10^{16}$ cm$^{-3}$, for example. The n-type impurity is N (nitrogen), for example.

The surface of the drift layer 10b is a face tilted at zero to eight degrees to the silicon face. The thickness of the drift layer 10b is not smaller than 5 μm and not greater than 150 μm, for example.

A p-type anode layer (the SiC layer) 12 in which the concentration of the p-type impurity is not lower than $1\times10^{18}$ cm$^{-3}$ and not higher than $5\times10^{19}$ cm$^{-3}$, for example, is formed on the surface of the drift layer 10b. The depth of the anode layer 12 is approximately 0.3 μm, for example.

A metallic anode electrode (the electrode) 14 is provided on the anode layer 12. The anode layer 12 and the anode electrode 14 are electrically connected.

The anode electrode 14 is made of a metal, for example. The metal forming the anode electrode 14 is TiN (titanium nitride), for example. Another metal such as Al (aluminum) may be stacked on the TiN. Other than a metal, it is possible to employ an electrically-conductive material such as polycrystalline silicon containing an n-type impurity.

The carbon concentration in the metal forming the anode electrode 14 is $1\times10^{18}$ cm$^{-3}$ or lower.

A p-type impurity region (the impurity region) 16 containing a p-type impurity is provided between the anode layer 12 and the anode electrode 14.

Figure 3:
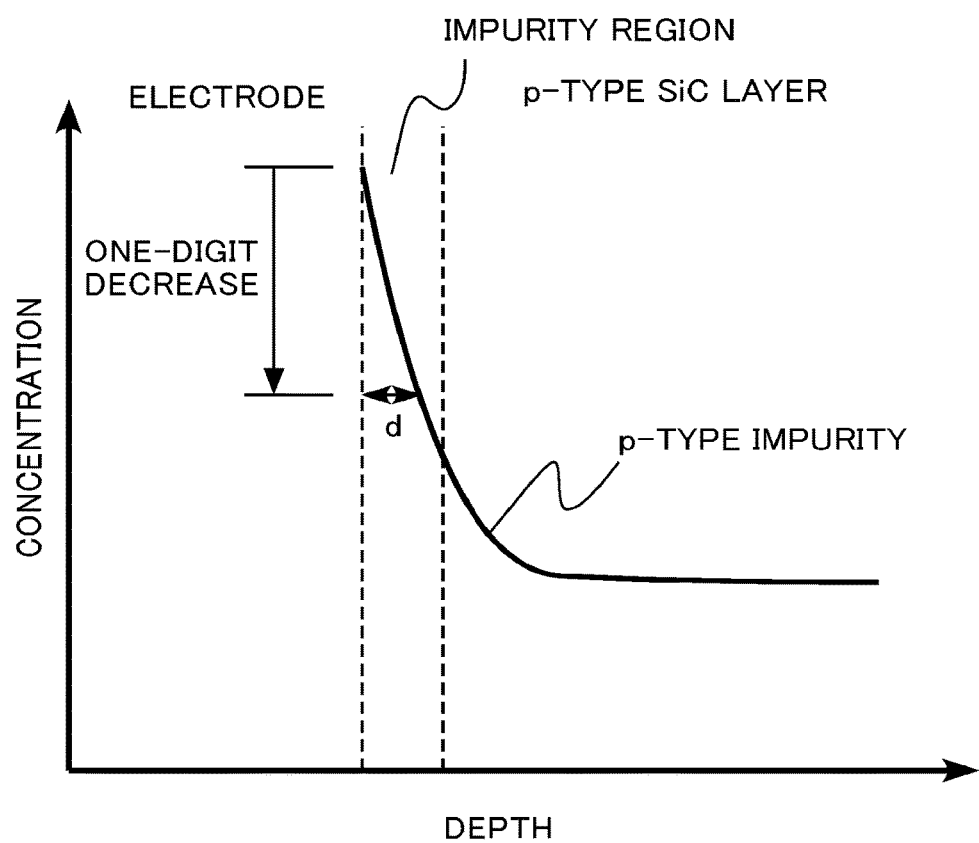
FIG. 3 is a diagram showing an elemental profile of the semiconductor device according to the first embodiment.

FIG. 3 is a diagram showing an elemental profile of the semiconductor device according to this embodiment. This diagram shows the concentration profile of the p-type impurity in a cross-section including the p-type anode layer (the p-type SiC layer) 12 and the anode electrode (the electrode) 14. In the p-type impurity region 16, the highest concentration of the p-type impurity is not lower than $1\times10^{20}$ cm$^{-3}$ and not higher than $5\times10^{22}$ cm$^{-3}$. The p-type impurity concentration in the p-type impurity region 16 can be measured by SIMS (Secondary Ion Mass Spectrometry), for example.

As shown in FIG. 3, the p-type impurity is segregated at a high concentration in the interface between the anode layer 12 and the anode electrode 14. The distance (d in FIG. 3) between the first position where the p-type impurity is highest and the second position where the concentration of the p-type impurity becomes one digit lower than the highest concentration of the p-type impurity on the side of the anode layer 12 is 50 nm or shorter. The distance between the first position where the p-type impurity is highest and the second position where the concentration of the p-type impurity becomes one digit lower than the highest concentration of the p-type impurity on the side of the anode layer 12 can be measured with an AFM (Atomic Force Microscope), for example. A concentration distribution can also be measured with an atom probe.

In the p-type impurity region 16, the p-type impurity enters the lattice site locations of the SiC and is activated, for example.

The p-type impurity in the p-type impurity region 16 is Al (aluminum), for example. Alternatively, the p-type impurity may be B (boron), Ga (gallium), or In (indium).

A metallic cathode electrode 18 is formed on the opposite side of the SiC substrate 10 from the drift layer 10b, or on the second plane side. The cathode electrode 18 is formed with stacked layers that are a Ni (nickel) barrier metal layer and an Al (aluminum) metal layer formed on the barrier metal layer, for example. The Ni barrier metal layer and the Al metal layer may form an alloy through a reaction. Alternatively, the Ni and the SiC substrate 10 may form a silicide through a reaction.

Next, a semiconductor device manufacturing method according to this embodiment is described. The semiconductor device manufacturing method according to this embodiment includes: performing ion implantation of an impurity into a SiC layer in a predetermined projected range; forming an oxide film by oxidizing the SiC layer down to a deeper region than the projected range of the ion implantation; removing the oxide film; and forming an electrode on the SiC layer. The semiconductor device manufacturing method according to this embodiment is an example of a method of manufacturing the semiconductor device shown in FIG. 1.

Figure 4:
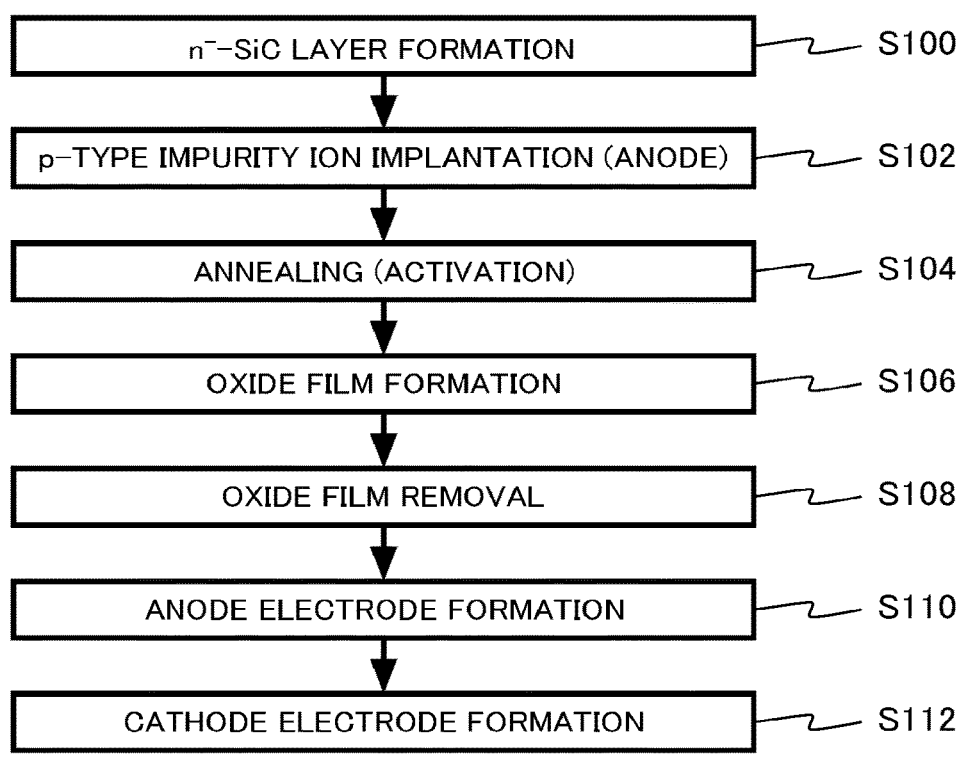
FIG. 4 is a process flowchart showing an example of a semiconductor device manufacturing method according to the first embodiment.

FIG. 4 is a process flowchart showing an example of the semiconductor device manufacturing method according to this embodiment. FIGS. 5 through 8 are schematic cross-sectional views of the semiconductor device being manufactured by the semiconductor device manufacturing method according to this embodiment.

As shown in FIG. 4, the semiconductor device manufacturing method according to this embodiment includes n⁻-SiC layer formation (step S100), p-type impurity ion implantation (step S102), annealing (step S104), oxide film formation (step S106), oxide film removal (step S108), anode electrode formation (step S110), and cathode electrode formation (step S112).

First, the n-type SiC layer 10a having the first plane as the silicon face and the second plane as the carbon face is prepared.

Figure 5:
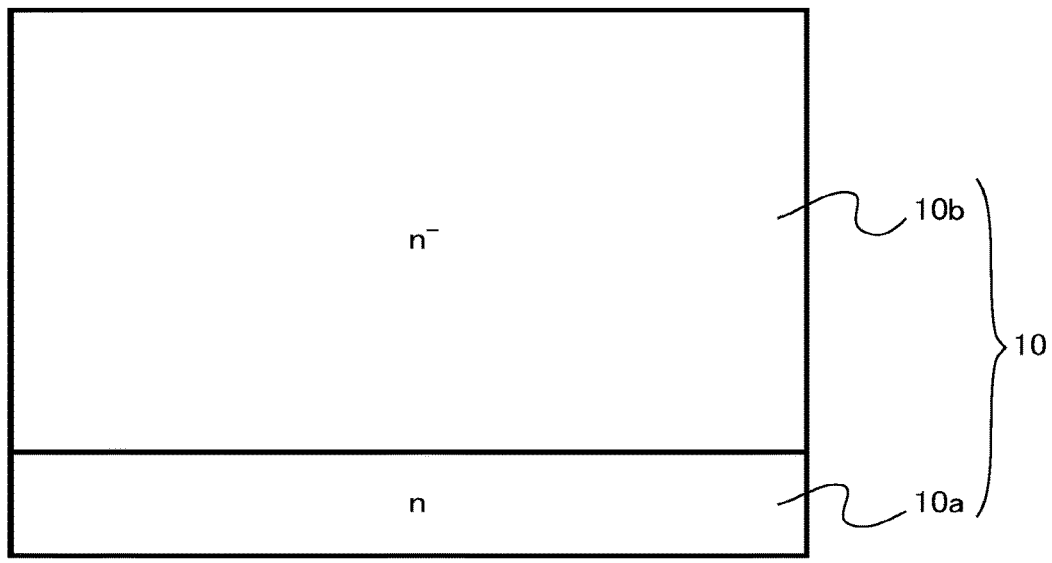
FIG. 5 is a schematic cross-sectional view of the semiconductor device being manufactured by the semiconductor device manufacturing method according to the first embodiment.

In step S100, the n⁻-type SiC drift layer 10b is formed on the first plane of the SiC layer 10a by an epitaxial growth technique. The n-type SiC layer 10a and the n⁻-type drift layer 10b constitute the SiC substrate 10 (FIG. 5).

Figure 6:
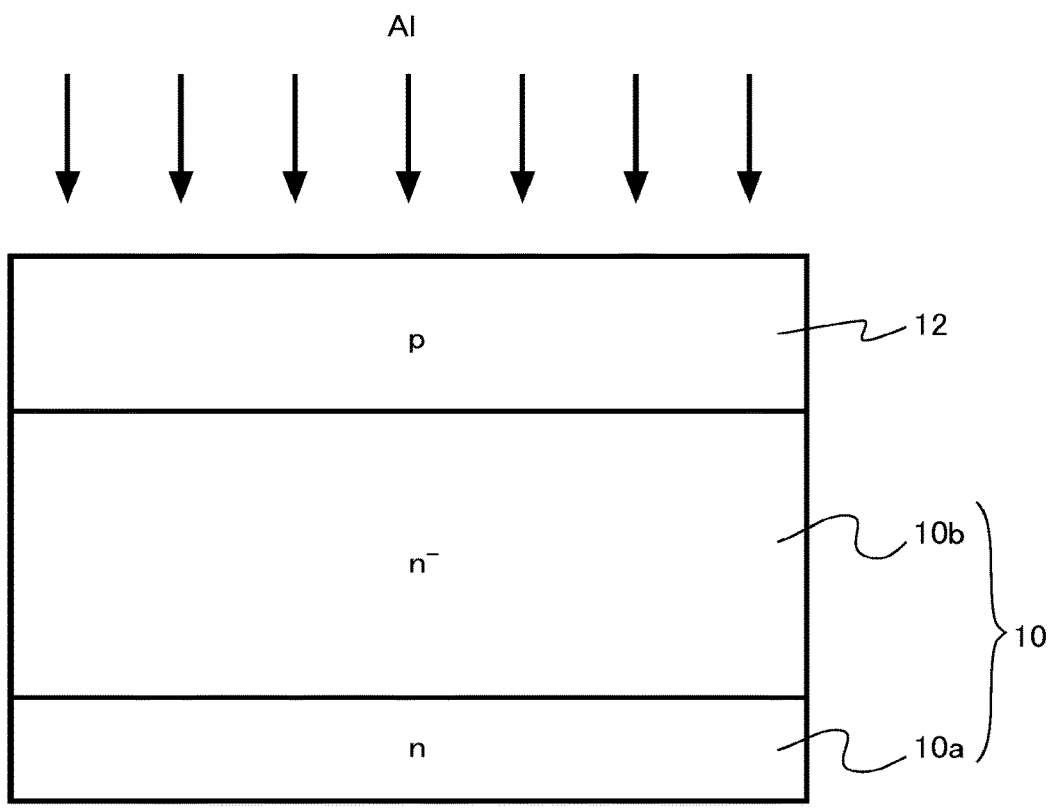
FIG. 6 is a schematic cross-sectional view of the semiconductor device being manufactured by the semiconductor device manufacturing method according to the first embodiment.

In step S102, p-type impurity ions are implanted into the drift layer 10b by a known ion implantation technique (FIG. 6). The p-type impurity is Al (aluminum), for example. The dose amount in the ion implantation is not smaller than $1 \times 10^{15}$ cm⁻² and not larger than $1 \times 10^{17}$ cm⁻², for example. So as to make the later-formed p-type impurity region 16 a high-concentration region, the dose amount is preferably $1 \times 10^{16}$ cm⁻² or larger.

In step S104, after p-type impurity ions are implanted, activation annealing is performed to activate the p-type impurity. The activation annealing is performed in an inert gas atmosphere at a temperature not lower than 1700° C. and not higher than 1900° C., for example.

Through the p-type impurity ion implantation and the activation annealing, the p-type anode layer 12 is formed.

Figure 7:
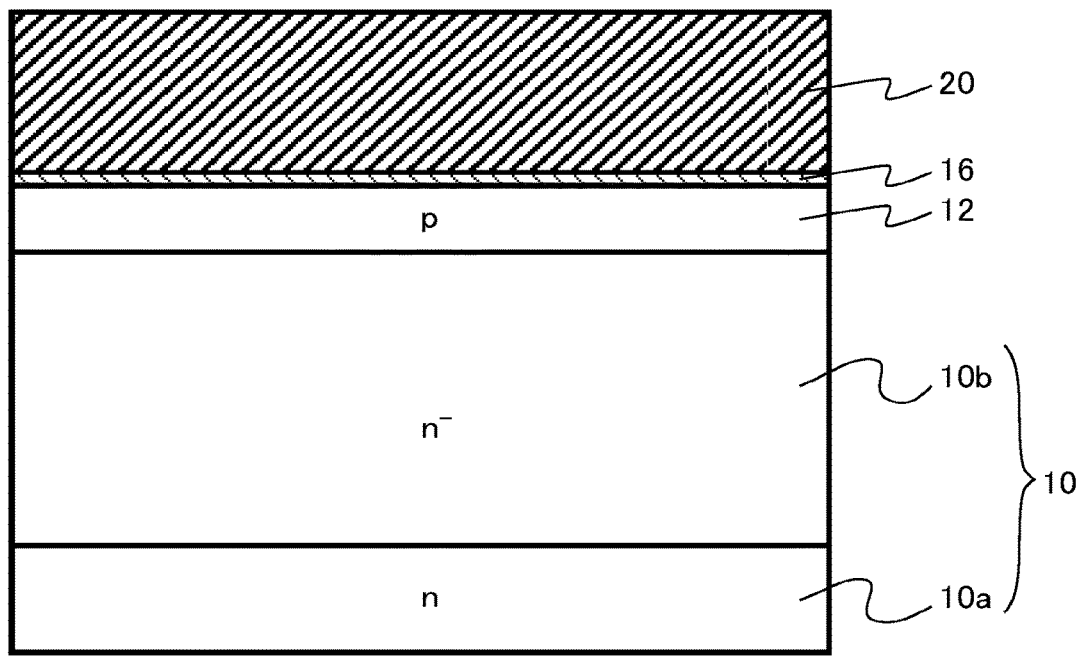
FIG. 7 is a schematic cross-sectional view of the semiconductor device being manufactured by the semiconductor device manufacturing method according to the first embodiment.

In step S106, the drift layer 10b is thermally oxidized, so that an oxide film 20 is formed (FIG. 7). The drift layer 10b is thermally oxidized down to a deeper region than the projected range (Rp) of the Al ion implantation, and the oxide film 20 is formed.

The thermal oxidation is performed in an oxidizing atmosphere at a temperature not lower than 800° C. and not higher than 1500° C., for example. The temperature is preferably not lower than 900° C. and not higher than 1350° C. More preferably, the temperature is not lower than 1000° C. and not higher than 1300° C.

The thickness of the oxide film 20 to be formed depends on the projected range (Rp). In a case where a Si face is used as in this embodiment, the thickness of the oxide film 20 is preferably not smaller than 50 nm and not greater than 1000 nm, and more preferably, not smaller than 100 nm and not greater than 300 nm. If the thickness of the oxide film 20 is lower than the above range, the p-type impurity region 16 might not become a region with a sufficiently high p-type impurity concentration. If the thickness of the oxide film 20 exceeds the above range, the production time might become longer, and the production costs might become higher.

At the time of the formation of the oxide film 20, the p-type impurity piles up and is segregated at a high concentration in the interface between the oxide film 20 and the anode layer 12, to form the p-type impurity region 16. The p-type impurity enters carbon vacancies formed in the surface of the anode layer 12 at the time of the thermal oxidation, and is then activated. Alternatively, the p-type impurity enters the Si lattice site locations after carbon vacancies formed in the surface of the anode layer 12 at the time of the thermal oxidation are substituted by Si (silicon).

Also, interstitial carbon generated in the surface of the anode layer 12 at the time of the thermal oxidation diffuses in the anode layer 12 and the SiC substrate 10, and enters carbon vacancies in the anode layer 12 and the SiC substrate 10. As a result, the carbon vacancy concentration in the anode layer 12 and the SiC substrate 10 becomes lower.

Figure 8:
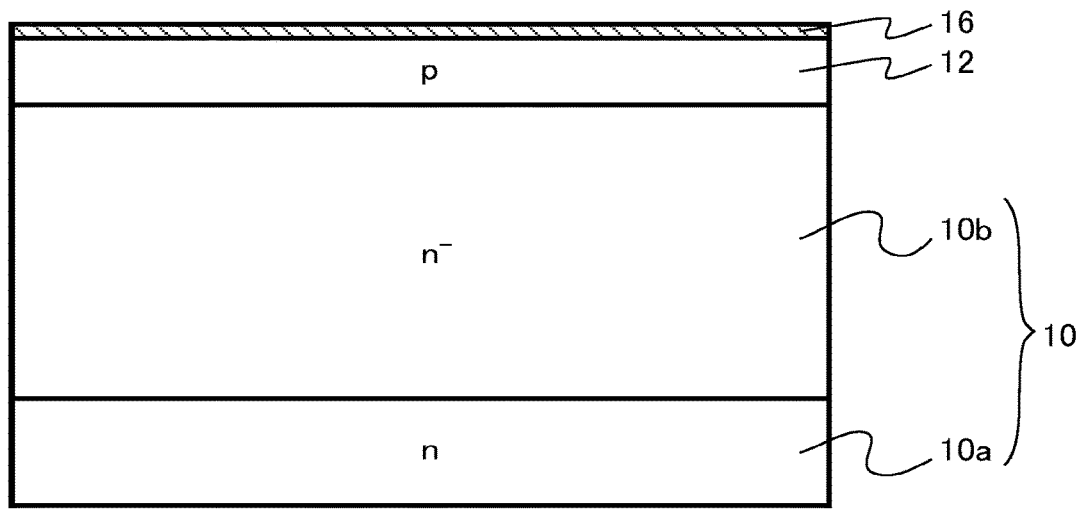
FIG. 8 is a schematic cross-sectional view of the semiconductor device being manufactured by the semiconductor device manufacturing method according to the first embodiment.

In step S108, the oxide film 20 is removed (FIG. 8). For example, the oxide film 20 is removed by hydrofluoric-acid wet etching.

In step S110, the anode electrode 14 is then formed on the anode layer 12 through a known process. In step S112, the cathode electrode 18 is formed on the lower surface side of the SiC substrate 10, so that the PIN diode 100 of this embodiment is completed.

In the description below, the functions and the effects of the semiconductor device and the semiconductor device manufacturing method according to this embodiment are described.

When SiC was thermally oxidized, the stability of the impurity existing in the SiC was determined by the first-principle calculation. In the interface between the SiC and the oxide film at the time of the thermal oxidation, the energy difference between a case where the impurity in the SiC diffuses into the oxide film and a case the impurity remains in the SiC was calculated.

As a result of the first-principle calculation, it became apparent that any p-type impurity, which was Al (aluminum), B (boron), Ga (gallium), or In (indium), and any n-type impurity, which was N (nitrogen), As (arsenic), P (phosphorus), or Sb (antimony), were more stable when staying in the SiC than when diffusing into the oxide film. The diffusion coefficient in the SiC in the p-type impurity and the n-type impurity was extremely small.

Figure 9A:
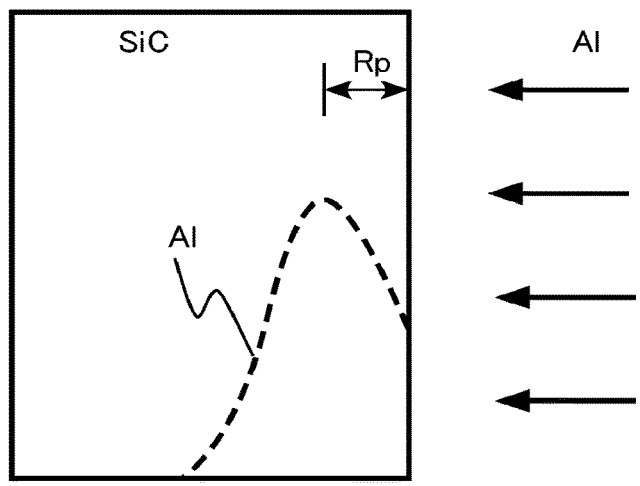
FIGS. 9A, 9B, and 9C are diagrams for explaining a function of the first embodiment.
Figure 9B:
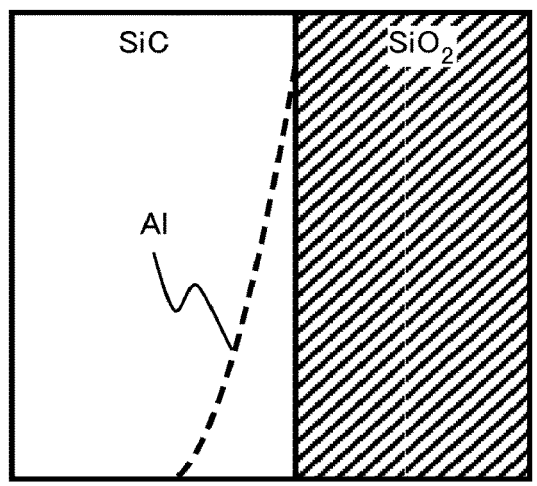
Figure 9C:
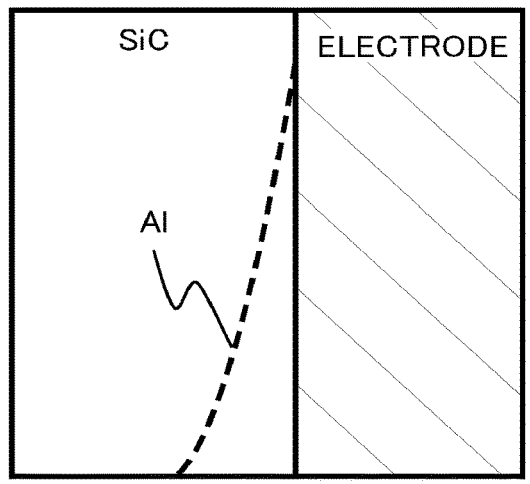

FIGS. 9A, 9B, and 9C are diagrams for explaining a function of this embodiment. In each of FIGS. 9A, 9B, and 9C, the right side is the front surface side (the first plane side) of the SiC substrate, and the left side is the back surface side (the second plane side) of the SiC substrate.

In this embodiment, for example, Al (aluminum) ions are implanted as the p-type impurity into SiC from the front surface side, and are activated by annealing (FIG. 9A). FIG. 9A shows the projected range (Rp) of the ion implantation.

After that, a silicon oxide film is formed through thermal oxidation (FIG. 9B). At this point, Al is more stable in terms of energy in a case where the Al stays on the SiC side than in a case where the Al diffuses into the silicon oxide film, as described above. The diffusion coefficient of the Al in the SiC is extremely small. Therefore, the Al piles up in the interface between the SiC and the silicon oxide film. Particularly, in this embodiment, thermal oxidation is performed down to a deeper region than the projected range of the ion implantation, so that an oxide film is formed. Therefore, a large amount of Al piles up in the interface, and a narrow p-type impurity region at a high concentration is formed in the interface.

When the silicon oxide film is formed, carbon is released from the SiC lattices, and carbon vacancies are formed. The Al enters the carbon vacancies, and is stabilized. Thus, the Al is activated. Alternatively, the Si (silicon) of the SiC enters the carbon vacancies, and the Al enters the Si lattice site locations of the SiC and is activated. Accordingly, the activated Al exists at a high concentration in the p-type impurity region. That is, as the Al in the p-type impurity region is activated through oxidation in the process according to this embodiment, the high-temperature process for activating after the oxidation does not need to be performed.

A metallic electrode, for example, is formed on the p-type impurity region in which the activated Al exists at a high concentration (FIG. 9C). The barrier width between the p-type SiC and the electrode is made narrower by the existence of the p-type impurity region in which the concentration of the activated impurity is high. Thus, a low-resistance ohmic contact is realized between the p-type SiC and the electrode.

With the above described function, a low-resistance ohmic contact is realized between the anode layer 12 and the anode electrode 14 in the PIN diode 100 according to this embodiment. Thus, the PIN diode 100 with a low on-state resistance and a large forward current is realized.

Also, the p-type impurity region 16 is formed in an extremely narrow region of 50 nm or smaller, for example, in width in the interface between the anode layer 12 and the anode electrode 14 in this embodiment. Accordingly, it becomes easier to control the p-type impurity concentration in the anode layer 12 so as to optimize the characteristics other than the contact resistance, such as the breakdown voltage of the pn junction and the parasitic resistance.

So as to make the p-type impurity region 16 a high-concentration layer and increase the degree of freedom in setting the impurity concentration in the anode layer 12, the width of the p-type impurity region 16 in the depth direction is preferably small. Therefore, the distance (d in FIG. 3) between the first position where the p-type impurity is highest and the second position where the concentration of the p-type impurity becomes one digit lower than the highest concentration of the p-type impurity on the side of the anode layer 12 is preferably 20 nm or shorter, and more preferably, 10 nm or shorter.

Also, by the method of manufacturing the PIN diode 100 according to this embodiment, interstitial carbon generated in the surface of the anode layer 12 at the time of thermal oxidation diffuses in the anode layer 12 and the SiC substrate 10, and enters carbon vacancies in the anode layer 12 and the SiC substrate 10. As a result, the carbon vacancy concentration in the anode layer 12 and the SiC substrate 10 becomes lower.

Carbon vacancies in SiC lead to a decrease in the minority carrier lifetime and an increase in the impurity layer resistance. According to this embodiment, the carbon vacancy concentration in the anode layer 12 and the SiC substrate 10 becomes lower. Accordingly, the minority carrier lifetime becomes longer, and the impurity layer resistance becomes lower. Thus, the PIN diode 100 with a low on-state resistance is realized.

There is also a method of forming an electrode with a low contact resistance by forming a silicide through a reaction between SiC and a metal, for example. In this case, excess carbon existing in the interface between the SiC and the silicide and in the silicide film might cause film peeling of the electrode.

As the high-concentration p-type impurity region 16 is formed by the method of manufacturing the PIN diode 100 according to this embodiment, the silicidation between the SiC and the electrode is not necessarily performed. The excess carbon taken into the oxide film at the time of thermal oxidation is removed through the oxide film removal.

Accordingly, the anode electrode 14 in which the carbon concentration in the metal has been reduced to $1 \times 10^{18}$ cm$^{-3}$ or lower can be formed. Thus, the highly-reliable PIN diode 100 that does not have film peeling or the like can be realized.

As described so far, according to this embodiment, the PIN diode 100 with a low contact resistance is realized.

Second Embodiment

A semiconductor device according to this embodiment differs from the semiconductor device according to the first embodiment in that an n-type impurity region is provided in the interface between the n-type SiC substrate and an electrode. Explanation of the same aspects of those of the first embodiment will not be repeated in the description below.

Figure 10:
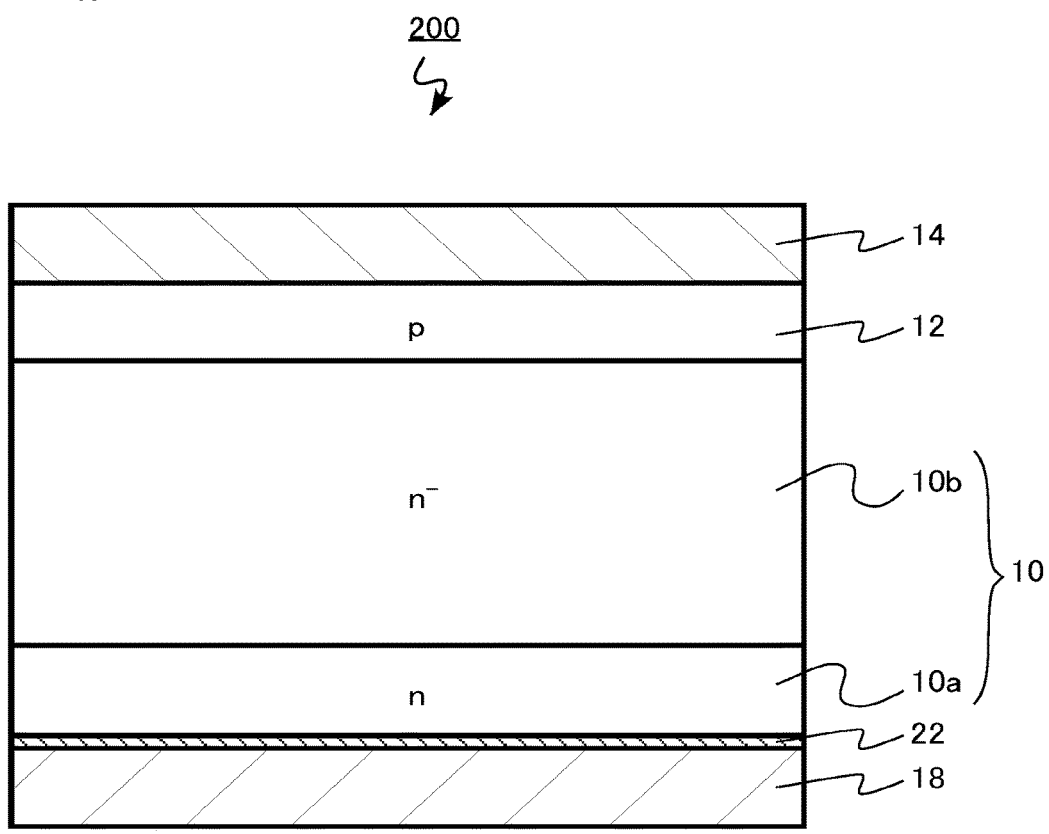
FIG. 10 is a schematic cross-sectional view of a semiconductor device according to a second embodiment.

FIG. 10 is a schematic cross-sectional view of the structure of a PIN diode that is a semiconductor device according to this embodiment.

This PIN diode 200 includes a SiC substrate 10, an anode layer 12, an anode electrode 14, a cathode electrode 18, and an n-type impurity region 22. The SiC substrate 10 is formed with an n-type SiC layer 10a and an n$^-$-type drift layer 10b on the SiC layer 10a. The PIN diode 200 includes the n-type impurity region 22.

In this embodiment, the anode electrode 14 is made of a metal, for example. The metal forming the anode electrode 14 is formed with stacked layers that are a Ni (nickel) barrier metal layer and an Al (aluminum) metal layer formed on the barrier metal layer, for example. The Ni barrier metal layer and the Al metal layer may form an alloy through a reaction. Alternatively, the Ni and the SiC substrate 10 may form a silicide through a reaction.

The cathode electrode 18 is made of a metal, for example. The metal forming the cathode electrode 18 is TiN (titanium nitride), for example. Another metal such as Al (aluminum) may be stacked on the TiN.

The n-type impurity region 22 is provided between the n-type SiC layer 10a and the cathode electrode 18. The n-type impurity region 22 contains an n-type impurity.

In the n-type impurity region 22, the highest concentration of the n-type impurity is not lower than $1 \times 10^{20}$ cm$^{-3}$ and not higher than $5 \times 10^{22}$ cm$^{-3}$. The n-type impurity is segregated at a high concentration in the interface between the n-type SiC layer 10a and the cathode electrode 18.

The distance between the first position where the n-type impurity is highest and the second position where the concentration of the n-type impurity becomes one digit lower than the highest concentration of the n-type impurity on the side of the n-type SiC layer 10a is 50 nm or shorter. This distance is preferably 20 nm or shorter, and more preferably, 10 nm or shorter.

Next, a semiconductor device manufacturing method according to this embodiment is described. The semiconductor device manufacturing method according to this embodiment includes: performing ion implantation of an impurity into a SiC layer; performing oxidation down to the region containing 90% or more of the impurity implanted through the ion implantation; removing the oxide film; and forming an electrode on the SiC layer. The semiconductor device manufacturing method according to this embodiment is an example of a method of manufacturing the semiconductor device shown in FIG. 10. The region containing 90% or more of the impurity introduced through the ion implantation is a deeper region than three times the projected range, for example. The region might need to be almost four times as deep as the projected range depending on the profile of the ion implantation.

Figure 11:
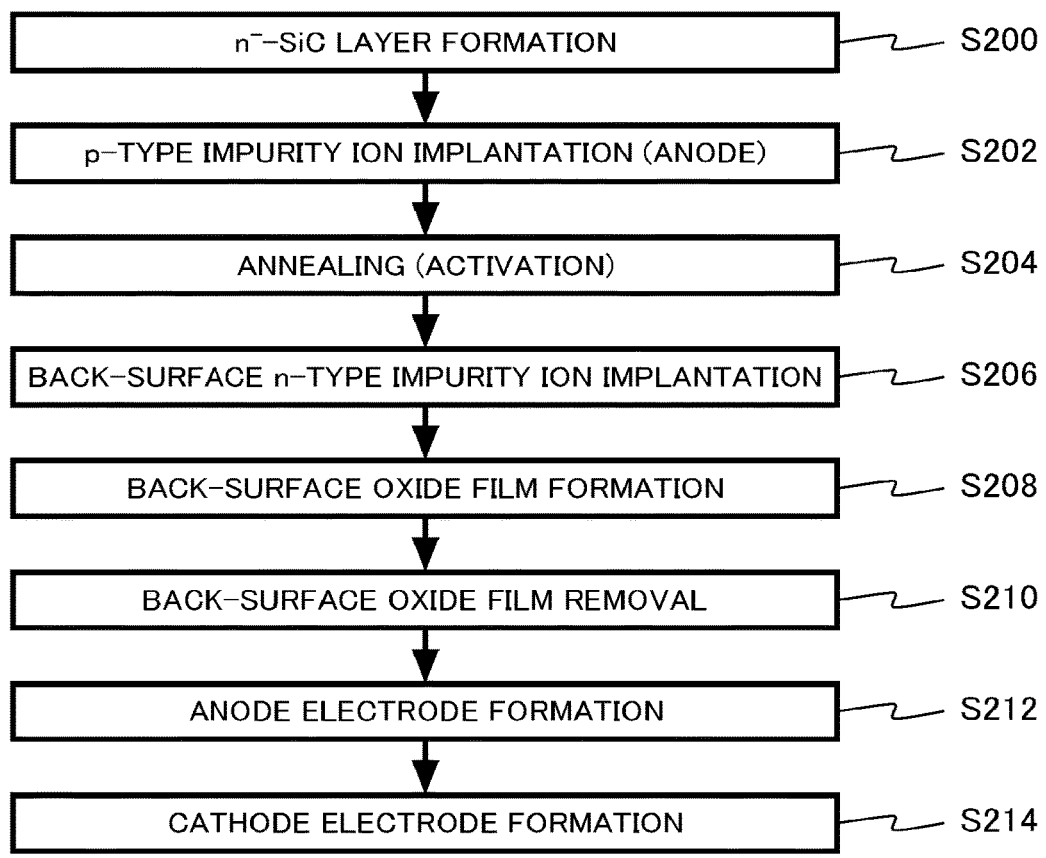
FIG. 11 is a process flowchart showing an example of a semiconductor device manufacturing method according to the second embodiment.

FIG. 11 is a process flowchart showing an example of the semiconductor device manufacturing method according to this embodiment. FIGS. 12 through 15 are schematic cross-sectional views of the semiconductor device being manufactured by the semiconductor device manufacturing method according to this embodiment.

As shown in FIG. 11, the semiconductor device manufacturing method according to this embodiment includes n⁻-SiC layer formation (step S200), p-type impurity ion implantation (step S202), annealing (step S204), back surface n-type impurity ion implantation (step S206), back surface oxide film formation (step S208), back surface oxide film removal (step S210), anode electrode formation (step S212), and cathode electrode formation (step S214).

First, the n-type SiC layer 10a having the first plane as the silicon face and the second plane as the carbon face is prepared. It should be noted that the second plane of the n-type SiC layer 10a is referred as the back surface.

In step S200, the n⁻-type drift layer 10b is formed on the first plane of the SiC layer 10a by an epitaxial growth technique. The n-type SiC layer 10a and the n⁻-type drift layer 10b constitute the SiC substrate 10.

In step S202, p-type impurity ions are implanted into the drift layer 10b by a known ion implantation technique. The p-type impurity is Al (aluminum), for example.

Figure 12:
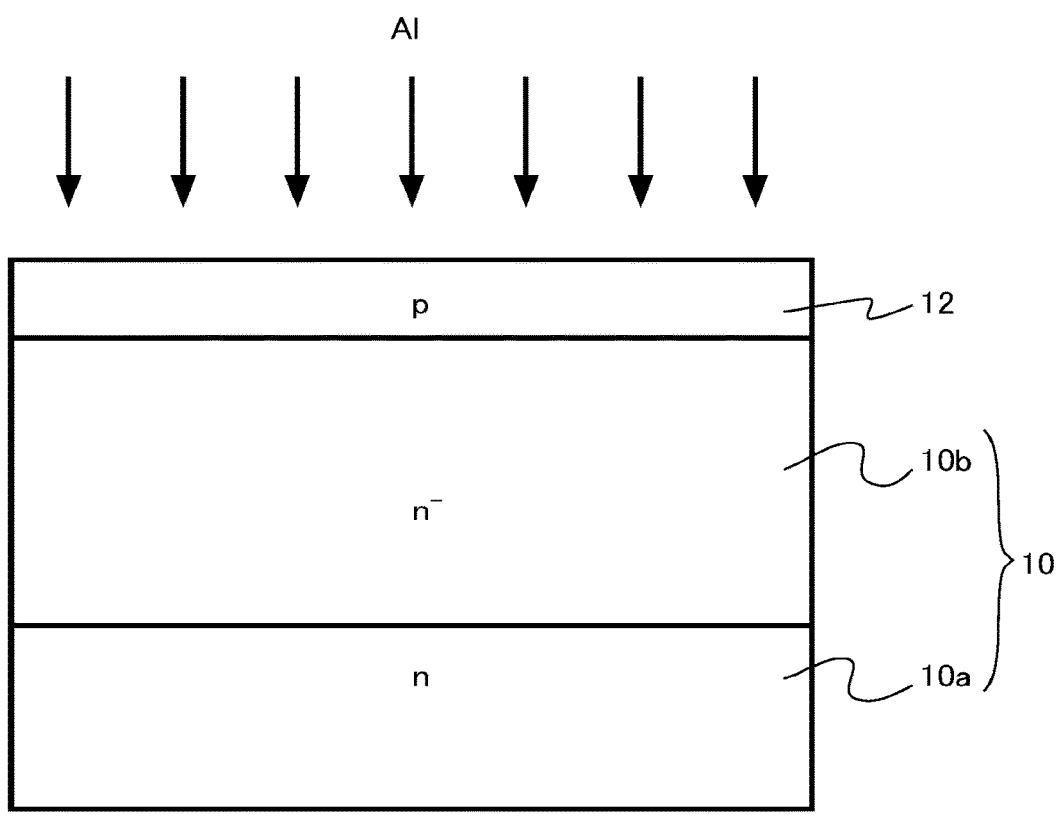
FIG. 12 is a schematic cross-sectional view of the semiconductor device being manufactured by the semiconductor device manufacturing method according to the second embodiment.

In step S204, after p-type impurity ions are implanted, activation annealing is performed to activate the p-type impurity. The activation annealing is performed in an inert gas atmosphere at a temperature not lower than 1700° C. and not higher than 1900° C., for example. Through the p-type impurity ion implantation and the activation annealing, the p-type anode layer 12 is formed (FIG. 12).

Figure 13:
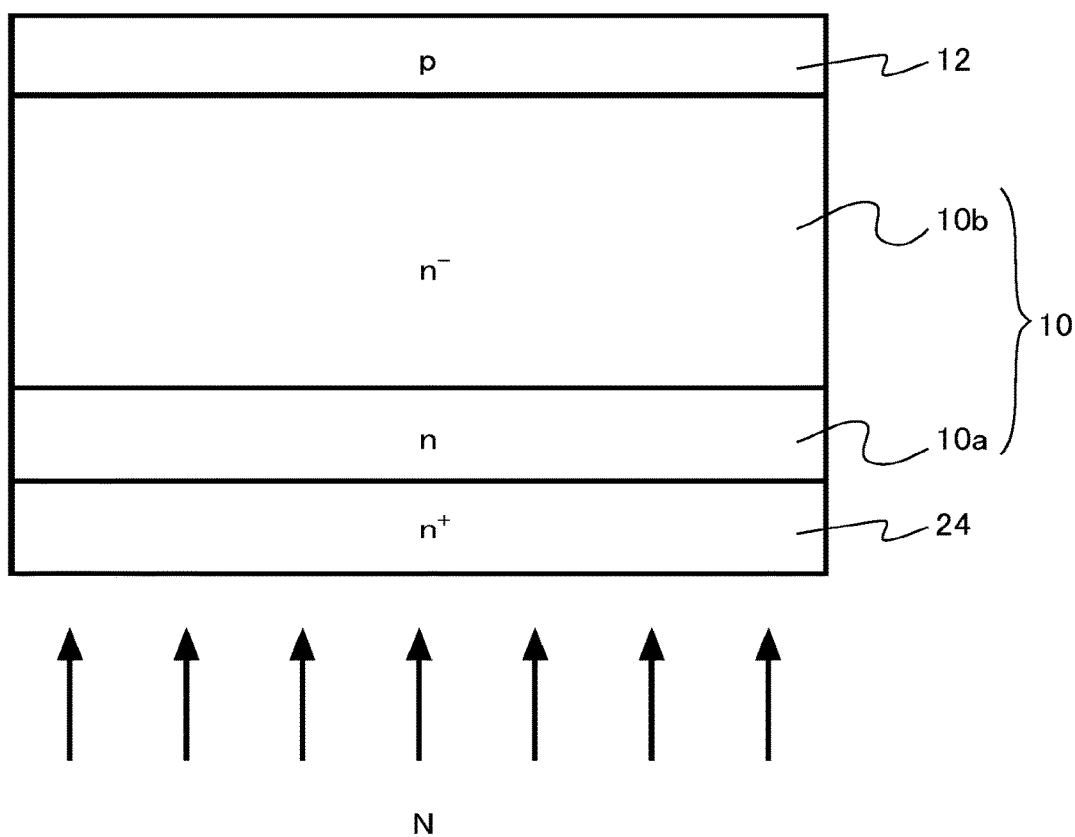
FIG. 13 is a schematic cross-sectional view of the semiconductor device being manufactured by the semiconductor device manufacturing method according to the second embodiment.

In step S206, n-type impurity ions are implanted into the n-type SiC layer 10a from the back surface side by a known ion implantation technique. An n⁺-type region 24 is formed in the region into which the n-type impurity ions have been implanted (FIG. 13). The n-type impurity is N (nitrogen), for example. Alternatively, the n-type impurity may be As (arsenic), P (phosphorus), or Sb (antimony).

The dose amount in the ion implantation is not smaller than $1 \times 10^{15}$ cm$^{-2}$ and not larger than $1 \times 10^{17}$ cm$^{-2}$, for example. So as to make the later-formed n-type impurity region 22 a high-concentration region, the dose amount is preferably $1 \times 10^{16}$ cm$^{-2}$ or larger.

Figure 14:
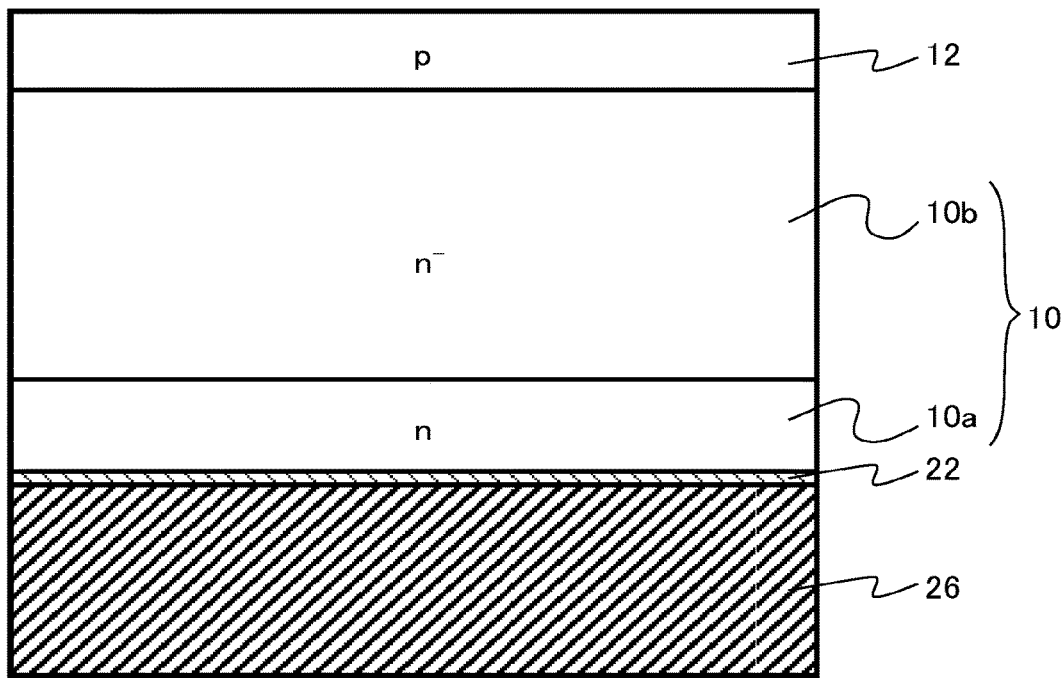
FIG. 14 is a schematic cross-sectional view of the semiconductor device being manufactured by the semiconductor device manufacturing method according to the second embodiment.

In step S208, the n-type SiC layer 10a is thermally oxidized, so that a back surface oxide film 26 is formed (FIG. 14). The n-type SiC layer 10a is thermally oxidized down to a deeper region than three times the projected range (Rp) of the ion implantation, and the back surface oxide film 26 is formed. At this point, almost the entire n⁺-type region 24 is oxidized. As almost the entire region 24 is oxidized, the dopant introduced through the ion implantation can be gathered and condensed.

The thermal oxidation is performed in an oxidizing atmosphere at a temperature not lower than 800° C. and not higher than 1500° C., for example. The temperature is preferably not lower than 900° C. and not higher than 1350° C. More preferably, the temperature is not lower than 1000° C. and not higher than 1300° C. The second plane is the carbon face. In the carbon face, the oxidation rate is 10 times as high as that in the silicon face. Accordingly, an oxide film having the same thickness as that in the silicon face can be formed in a shorter time or at a lower temperature than that in the silicon face.

The thickness of the back surface oxide film 26 to be formed depends on the projected range (Rp). In a case where a C face is used as in this embodiment, the thickness of the oxide film 26 is preferably not smaller than 500 nm and not greater than 10000 nm, and more preferably, not smaller than 1000 nm and not greater than 3000 nm. If the thickness of the oxide film 26 is smaller than the above range, oxidation might not be performed down to a region three times as deep as the projected range (Rp). If the thickness of the oxide film 26 exceeds the above range, the production time might become longer, and the production costs might become higher. The thickness of the oxide film 26 depends on the projected range (Rp). However, in a case where the face orientation of the face to be oxidized is an A face or an M face, the thickness of the oxide film 26 is approximately half the thickness in the case of the C face. The thickness of the oxide film 26 is preferably not smaller than 250 nm and not greater than 5000 nm, and more preferably, not smaller than 500 nm and not greater than 1500 nm. This is because, the oxidation rate is almost as half as that in the C face.

At the time of the formation of the back surface oxide film 26, the n-type impurity piles up and is segregated at a high concentration in the interface between the back surface oxide film 26 and the n-type SiC layer 10a, to form the n-type impurity region 22. The n-type impurity enters carbon vacancies formed in the surface of the SiC layer 10a at the time of the thermal oxidation, and is then activated. Alternatively, the n-type impurity enters the Si lattice site locations after carbon vacancies formed in the surface of the SiC layer 10a at the time of the thermal oxidation are substituted by Si (silicon).

Also, interstitial carbon generated in the surface of the SiC layer 10a at the time of the thermal oxidation diffuses in the SiC substrate 10, and enters carbon vacancies the SiC substrate 10. As a result, the carbon vacancy concentration in the SiC substrate 10 becomes lower.

Figure 15:
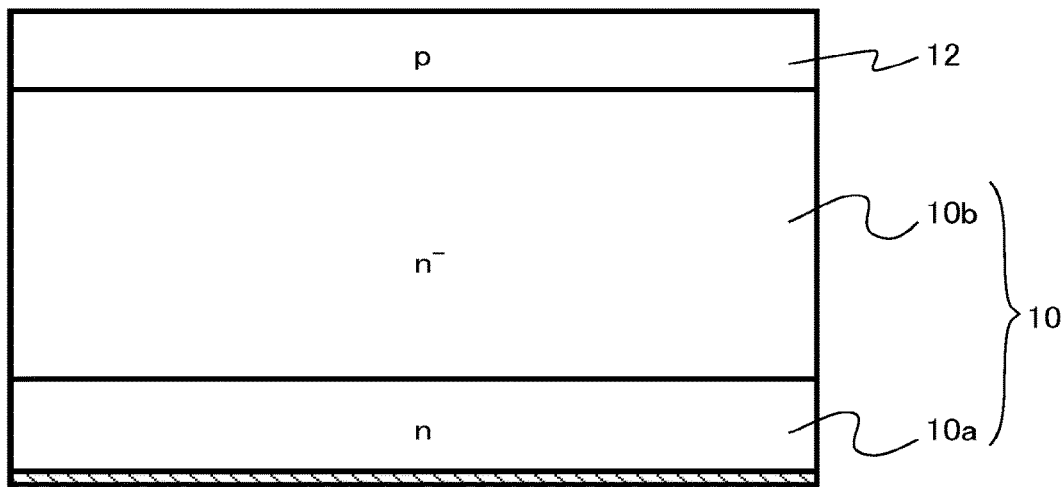
FIG. 15 is a schematic cross-sectional view of the semiconductor device being manufactured by the semiconductor device manufacturing method according to the second embodiment.

In step S210, the back surface oxide film 26 is removed (FIG. 15). For example, the back surface oxide film 26 is removed by hydrofluoric-acid wet etching.

In step S212, the anode electrode 14 is then formed on the anode layer 12 through a known process. In step S214, the cathode electrode 18 is formed on the back surface side of the SiC substrate 10, so that the PIN diode 200 of this embodiment shown in FIG. 10 is completed.

In the description below, the functions and the effects of the semiconductor device and the semiconductor device manufacturing method according to this embodiment are described.

As described above, it became apparent as a result of the first-principle calculation that any p-type impurity, which was Al (aluminum), B (boron), Ga (gallium), or In (indium), and any n-type impurity, which was N (nitrogen), As (arsenic), P (phosphorus), or Sb (antimony), were more stable when staying in the SiC than when diffusing into the oxide film. The diffusion coefficient in the SiC in the p-type impurity and the n-type impurity was extremely small.

Figure 16A:
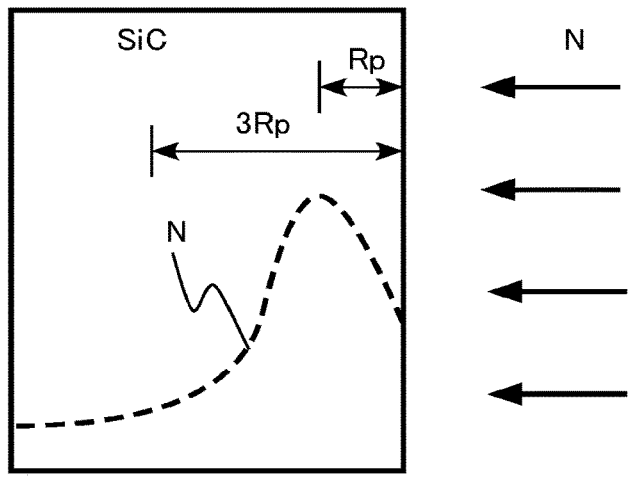
FIGS. 16A, 16B, and 16C are diagrams for explaining a function of the second embodiment.
Figure 16B:
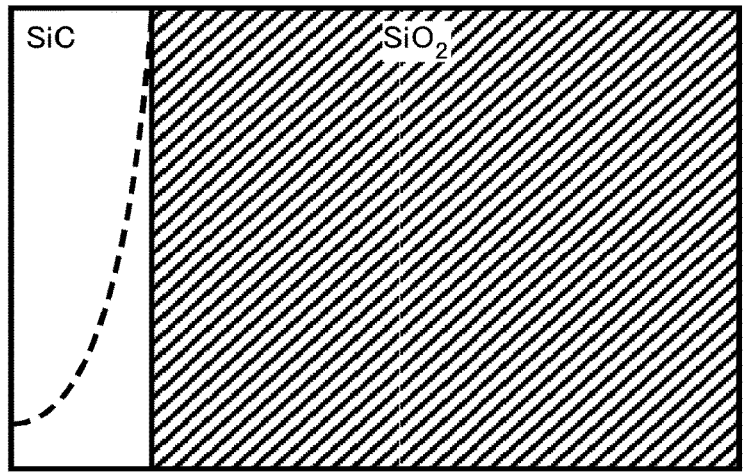
Figure 16C:
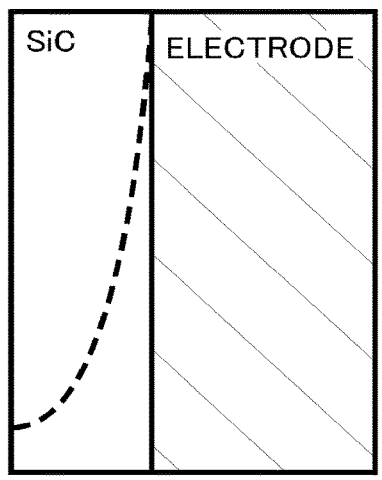

FIGS. 16A, 16B, and 16C are diagrams for explaining a function of this embodiment. In each of FIGS. 16A, 16B, and 16C, the right side is the back surface side (the second plane side) of the SiC substrate, and the left side is the front surface side (the first plane side) of the SiC substrate.

In this embodiment, for example, N (nitrogen) ions are implanted as the n-type impurity into SiC from the back surface side (FIG. 16A). FIG. 16A shows the projected range (Rp) of the ion implantation and a range (3Rp) three times as wide as the projected range.

After that, a silicon oxide film is formed through thermal oxidation (FIG. 16B). At this point, N is more stable in terms of energy in a case where the N stays on the SiC side than in a case where the N diffuses into the silicon oxide film, as described above. The diffusion coefficient of the N in the SiC is extremely small. Therefore, the N piles up in the interface between the SiC and the silicon oxide film. Particularly, in this embodiment, thermal oxidation is performed down to a region three times as deep as the projected range of the ion implantation, so that an oxide film is formed. Therefore, a large amount of N piles up in the interface, and a narrow n-type impurity region at a high concentration is formed in the interface.

When the silicon oxide film is formed, carbon is released from the SiC lattices, and carbon vacancies are formed. The N enters the carbon vacancies, and is stabilized. Thus, the N is activated. Alternatively, the Si (silicon) of the SiC enters the carbon vacancies, and the N enters the Si lattice site locations of the SiC and is activated. Accordingly, the activated N exists at a high concentration in the n-type impurity region.

In this embodiment, most of the region containing the N introduced through ion implantation is oxidized. Since the N is activated through the oxidation, it is not necessary to perform the annealing for activating the N after the ion implantation.

A metallic electrode, for example, is formed on the n-type impurity region in which the activated N exists at a high concentration (FIG. 16C). The barrier width between the n-type SiC and the electrode is made narrower by the existence of the n-type impurity region in which the concentration of the activated impurity is high. Thus, a low-resistance ohmic contact is realized between the n-type SiC and the electrode.

With the above described function, a low-resistance ohmic contact is realized between the SiC layer 10a and the cathode electrode 18 in the PIN diode 200 according to this embodiment. Thus, the PIN diode 200 with a low on-state resistance and a large forward current is realized.

Also, the n-type impurity region 22 is formed in an extremely narrow region of 50 nm or smaller, for example, in width in the interface between the SiC layer 10a and the cathode electrode 18 in this embodiment. Accordingly, it becomes easier to control the n-type impurity concentration in the SiC layer 10a so as to optimize the characteristics other than the contact resistance, such as the breakdown voltage of the pn junction and the parasitic resistance.

So as to make the n-type impurity region 22 a high-concentration layer and increase the degree of freedom in setting the impurity concentration in the SiC layer 10a, the width of the n-type impurity region 22 in the depth direction is preferably small. Therefore, the distance between the first position where the n-type impurity is highest and the second position where the concentration of the n-type impurity becomes one digit lower than the highest concentration of the n-type impurity on the side of the SiC layer 10a is preferably 20 nm or shorter, and more preferably, 10 nm or shorter.

Also, by the method of manufacturing the PIN diode 200 according to this embodiment, interstitial carbon generated in the surface of the SiC layer 10a at the time of thermal oxidation diffuses in the SiC substrate 10, and enters carbon vacancies in the SiC substrate 10. Accordingly, the carbon vacancy concentration in the SiC substrate 10 becomes lower.

Carbon vacancies in SiC lead to a decrease in the minority carrier lifetime and an increase in the impurity layer resistance. According to this embodiment, the carbon vacancy concentration in the SiC substrate 10 becomes lower. Accordingly, the minority carrier lifetime becomes longer, and the impurity layer resistance becomes lower. Thus, the PIN diode 200 with a low on-state resistance is realized.

There is also a method of forming an electrode by forming a silicide through a reaction between SiC and a metal, for example. In this case, excess carbon existing in the interface between the SiC and the silicide and in the silicide film might cause film peeling of the electrode.

As the high-concentration n-type impurity region 22 is formed by the method of manufacturing the PIN diode 200 according to this embodiment, the silicidation between the SiC and the electrode is not necessarily performed. The excess carbon taken into the oxide film at the time of thermal oxidation is removed through the oxide film removal.

Accordingly, the cathode electrode 18 in which the carbon concentration in the metal has been reduced to $1 \times 10^{18}$ cm$^{-3}$ or lower can be formed. Thus, the highly-reliable PIN diode 200 that does not have film peeling or the like can be realized.

As described so far, according to this embodiment, the PIN diode 200 with a low contact resistance is realized.

Third Embodiment

A semiconductor device according to this embodiment differs from the semiconductor devices according to the first and second embodiments in that the SiC layer includes an n-type region and a p-type region, the impurity region includes a first region containing an n-type impurity and a second region containing a p-type impurity, the first region is provided between the n-type region and an electrode, and the second region is provided between the p-type region and the electrode. Explanation of the same aspects of those of the first or second embodiment will not be repeated in the description below.

Figure 17:
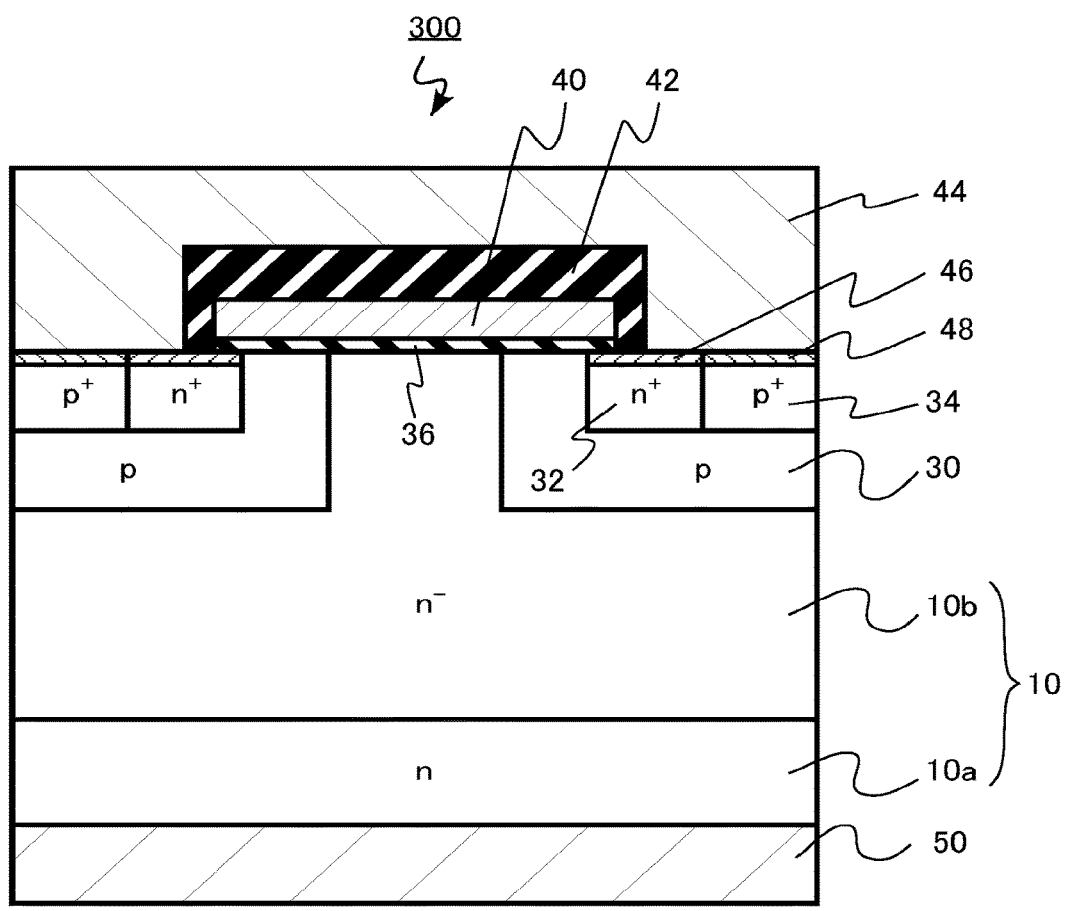
FIG. 17 is a schematic cross-sectional view of a semiconductor device according to a third embodiment.

FIG. 17 is a schematic cross-sectional view of the structure of a MOSFET that is a semiconductor device according to this embodiment. This MOSFET (Metal Oxide Semiconductor Field Effect Transistor) 300 is a Double Implantation MOSFET (DIMOSFET) having a p-well and a source region formed through ion implantation, for example.

This MOSFET 300 includes a SiC substrate 10. The SiC substrate 10 is formed with an n-type SiC layer 10a and an n⁻-type drift layer 10b on the SiC layer 10a.

The SiC layer 10a includes first and second planes. In FIG. 17, the first plane is the upper surface, and the second plane is the lower surface. The first plane is a plane tilted at zero to eight degrees to the silicon face. The SiC layer 10a is the SiC of 4H—SiC containing N (nitrogen), for example, as the n-type impurity at an impurity concentration not lower than $1\times10^{18}$ cm$^{-3}$ and not higher than $1\times10^{20}$ cm$^{-3}$, for example.

The drift layer 10b is an epitaxially grown layer of SiC formed on the SiC layer 10a through epitaxial growth, for example. The concentration of the n-type impurity in the drift layer 10b is not lower than $5\times10^{15}$ cm$^{-3}$ and not higher than $2\times10^{16}$ cm$^{-3}$, for example. The n-type impurity is N (nitrogen), for example.

The surface of the drift layer 10b is a surface tilted at zero to eight degrees to the silicon face. The thickness of the drift layer 10b is not smaller than 5 μm and not greater than 150 μm, for example.

P-type p-well regions 30 in which the concentration of the p-type impurity is not lower than approximately $5\times10^{15}$ cm$^{-3}$ and not higher than approximately $1\times10^{17}$ cm$^{-3}$ are formed on part of the surface of the drift layer 10b. The depth of the p-well regions 30 is approximately 0.6 μm, for example. The p-well regions 30 function as the channel regions of the MOSFET 300. The p-type impurity is Al, for example.

For example, N⁺-type source regions (the n-type region) 32 in which the concentration of the n-type impurity is not lower than approximately $1\times10^{18}$ cm$^{-3}$ and not higher than approximately $1\times10^{20}$ cm$^{-3}$ are formed on part of the surfaces of the p-well regions 30. The depth of the source regions 32 is smaller than the depth of the p-well regions 30, and is approximately 0.3 μm, for example. The n-type impurity is N (nitrogen), for example.

P⁺-type p-well contact regions (the p-type region) 34 in which the concentration of the p-type impurity is not lower than approximately $1\times10^{18}$ cm$^{-3}$ and not higher than approximately $1\times10^{20}$ cm$^{-3}$, for example, are formed on part of the surfaces of the p-well regions 30 and on the sides of the n⁺-type source regions 32. The depth of the p-well contact regions 34 is smaller than the depth of the p-well regions 30, and is approximately 0.3 μm, for example. The p-type impurity is Al, for example.

A gate insulating film 36 is continuously formed on the surfaces of the drift layer 10b and the p-well regions 30, so as to bridge over the layer and the regions. The gate insulating film 36 may be a silicon oxide film or a high-k insulating film, for example.

A gate electrode 40 is formed on the gate insulating film 36. The gate electrode 40 may be made of impurity-doped polycrystalline silicon, for example. An interlayer insulating film 42 formed with a silicon oxide film, for example, is formed on the gate electrode 40.

The p-well regions 30 interposed between the source regions 32 located below the gate electrode 40 and the drift layer 10b function as the channel regions of the MOSFET 300.

A conductive source/p-well common electrode 44 is provided over the source regions (the n-type region) 32 and the p-well contact regions (the p-type region) 34. The source regions 32, the p-well contact regions 34, and the source/p-well common electrode 44 are electrically connected.

The source/p-well common electrode 44 is made of a metal, for example. The metal forming the source/p-well common electrode 44 is TiN (titanium nitride), for example. Another metal such as Al (aluminum) may be stacked on the TiN. Other than a metal, it is possible to employ an electrically-conductive material such as polycrystalline silicon containing an impurity.

N-type impurity regions (the first region) 46 containing an n-type impurity are provided between the source regions (the n-type region) 32 and the source/p-well common electrode 44. P-type impurity regions (the second region) 48 containing a p-type impurity are provided between the p-well contact regions (the p-type region) 34 and the source/p-well common electrode 44.

In the n-type impurity regions 46, the highest concentration of the n-type impurity is not lower than $1\times10^{20}$ cm$^{-3}$ and not higher than $5\times10^{22}$ cm$^{-3}$. The n-type impurity is segregated at a high concentration in the interfaces between the source regions 32 and the source/p-well common electrode 44. The n-type impurity is N (nitrogen), for example. Alternatively, the n-type impurity may be As (arsenic), P (phosphorus), or Sb (antimony).

The distance between the first position where the n-type impurity is highest and the second position where the concentration of the n-type impurity becomes one digit lower than the highest concentration of the n-type impurity on the sides of the source regions (the n-type region) 32 is 50 nm or shorter. This distance is preferably 20 nm or shorter, and more preferably, 10 nm or shorter.

In the p-type impurity regions 48, the highest concentration of the p-type impurity is not lower than $1\times10^{20}$ cm$^{-3}$ and not higher than $5\times10^{22}$ cm$^{-3}$. The p-type impurity is segregated at a high concentration in the interfaces between the p-well contact regions 34 and the source/p-well common electrode 44. The p-type impurity is Al (aluminum), for example. Alternatively, the p-type impurity may be B (boron), Ga (gallium), or In (indium).

The distance between the position where the p-type impurity is highest and the position where the concentration of the p-type impurity becomes one digit lower than the highest concentration of the p-type impurity on the sides of the p-well contact regions (the p-type region) 34 is 50 nm or shorter. This distance is preferably 20 nm or shorter, and more preferably, 10 nm or shorter.

A conductive drain electrode 50 is formed on the second plane side of the SiC substrate 10. The drain electrode 50 is made of Ni (nickel), for example.

Next, a semiconductor device manufacturing method according to this embodiment is described. The semiconductor device manufacturing method according to this embodiment includes: forming the n-type region by performing first ion implantation of an n-type impurity into a SiC layer in a predetermined first projected range; forming the p-type region by performing second ion implantation of a p-type impurity into the SiC layer in a predetermined second projected range; forming an oxide film by oxidizing the SiC layer down to a deeper region than the first projected range and the second projected range; removing the oxide film; and forming an electrode on the n-type region and the p-type region. The semiconductor device manufacturing method according to this embodiment is an example of a method of manufacturing the semiconductor device shown in FIG. 17.

Figure 18:
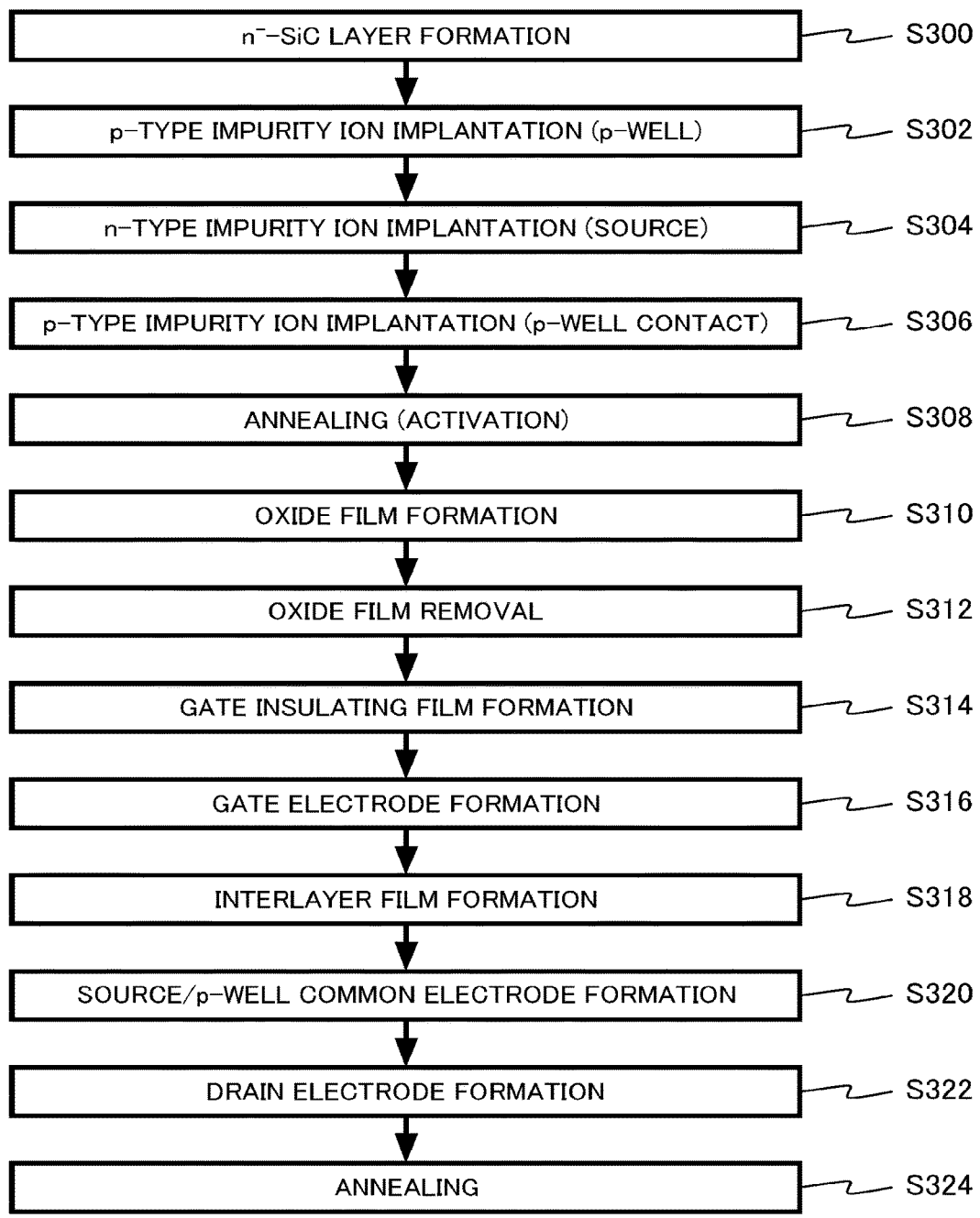
FIG. 18 is a process flowchart showing an example of a semiconductor device manufacturing method according to the third embodiment.

FIG. 18 is a process flowchart showing an example of the semiconductor device manufacturing method according to this embodiment. FIGS. 19 through 25 are schematic cross-sectional views of the semiconductor device being manufactured by the semiconductor device manufacturing method according to this embodiment.

As shown in FIG. 18, the semiconductor device manufacturing method according to this embodiment includes n⁻-SiC layer formation (step S300), p-type impurity ion implantation (step S302), n-type impurity ion implantation (step S304), p-type impurity ion implantation (step S306), annealing (step S308), oxide film formation (step S310), oxide film removal (step S312), gate insulating film formation (step S314), gate electrode formation (step S316), interlayer film formation (step S318), source/p-well common electrode formation (step S320), drain electrode formation (step S322), and annealing (step S324).

First, the n-type SiC layer 10a having the first plane as the silicon face and the second plane as the carbon face is prepared.

Figure 19:
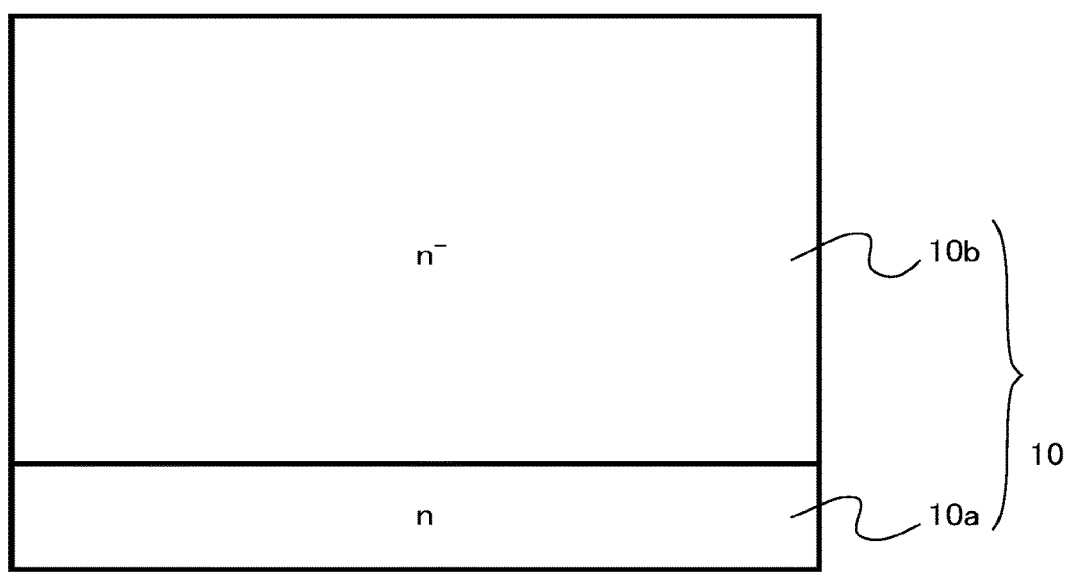
FIG. 19 is a schematic cross-sectional view of the semiconductor device being manufactured by the semiconductor device manufacturing method according to the third embodiment.

In step S300, the n⁻-type drift layer 10b is formed on the first plane of the SiC layer 10a by an epitaxial growth technique. The n-type SiC layer 10a and the n⁻-type drift layer 10b constitute the SiC substrate 10 (FIG. 19).

Figure 20:
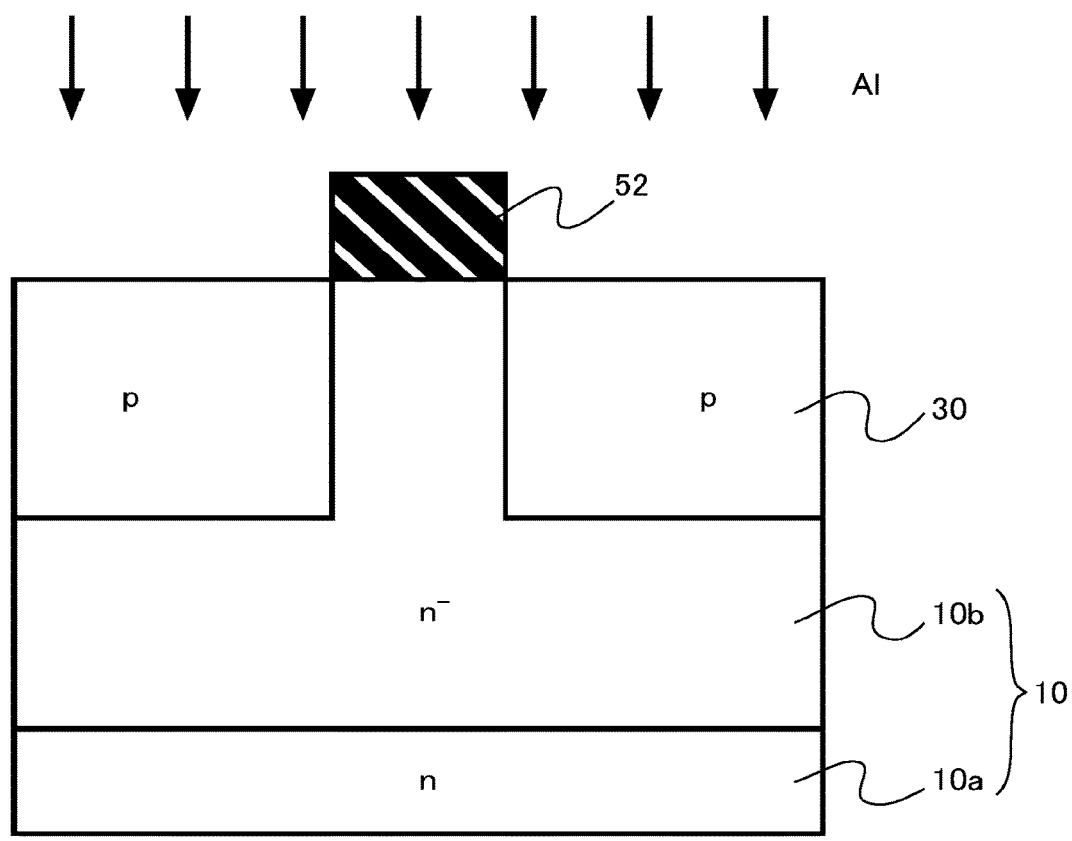
FIG. 20 is a schematic cross-sectional view of the semiconductor device being manufactured by the semiconductor device manufacturing method according to the third embodiment.

Patterning is then performed by photolithography and etching, to form a first mask material 52 made of SiO₂, for example. In step S302, Al as the p-type impurity is implanted into the drift layer 10b through ion implantation using the first mask material 52 as an ion implantation mask, to form the p-well regions 30 (FIG. 20).

Figure 21:
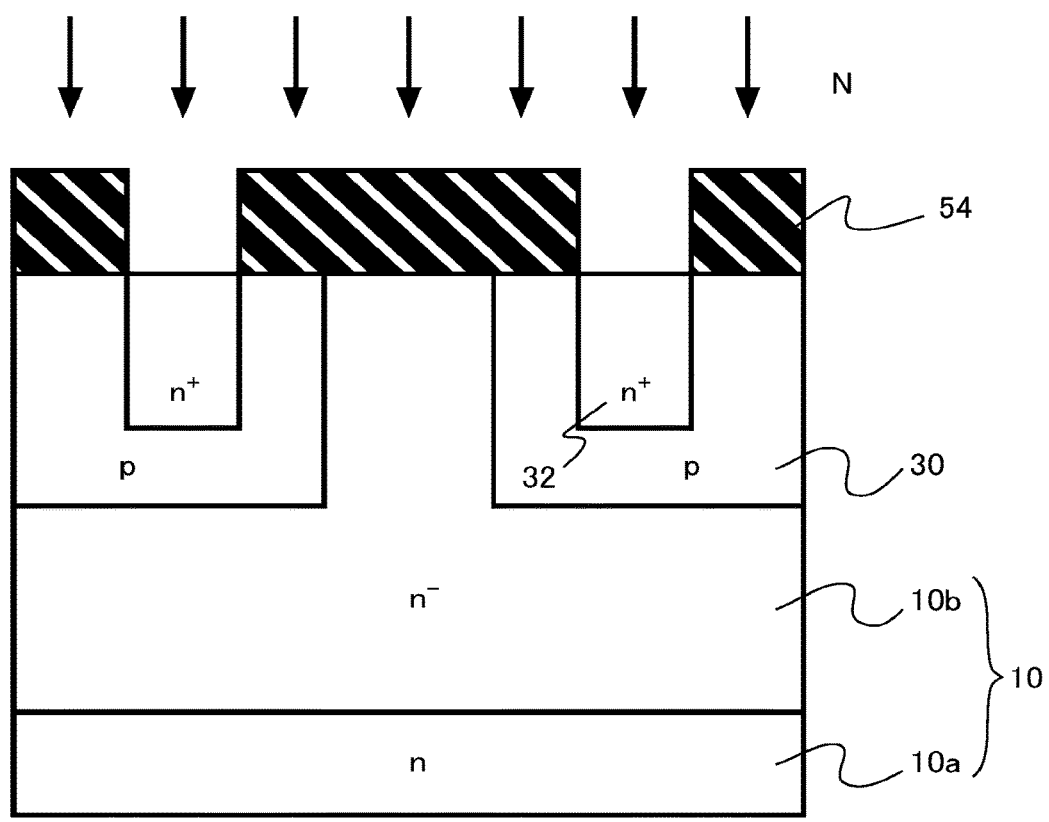
FIG. 21 is a schematic cross-sectional view of the semiconductor device being manufactured by the semiconductor device manufacturing method according to the third embodiment.

Patterning is then performed by photolithography and etching, to form a second mask material 54 made of SiO₂, for example. In step S304, N as the n-type impurity is implanted into the drift layer 10b through ion implantation using the second mask material 54 as an ion implantation mask, to form the source regions (the n-type region) 32 (FIG. 21). This ion implantation is referred to as the first ion implantation. The concentration profile of the N after the first ion implantation has the first projected range ($Rp_1$).

Figure 22:
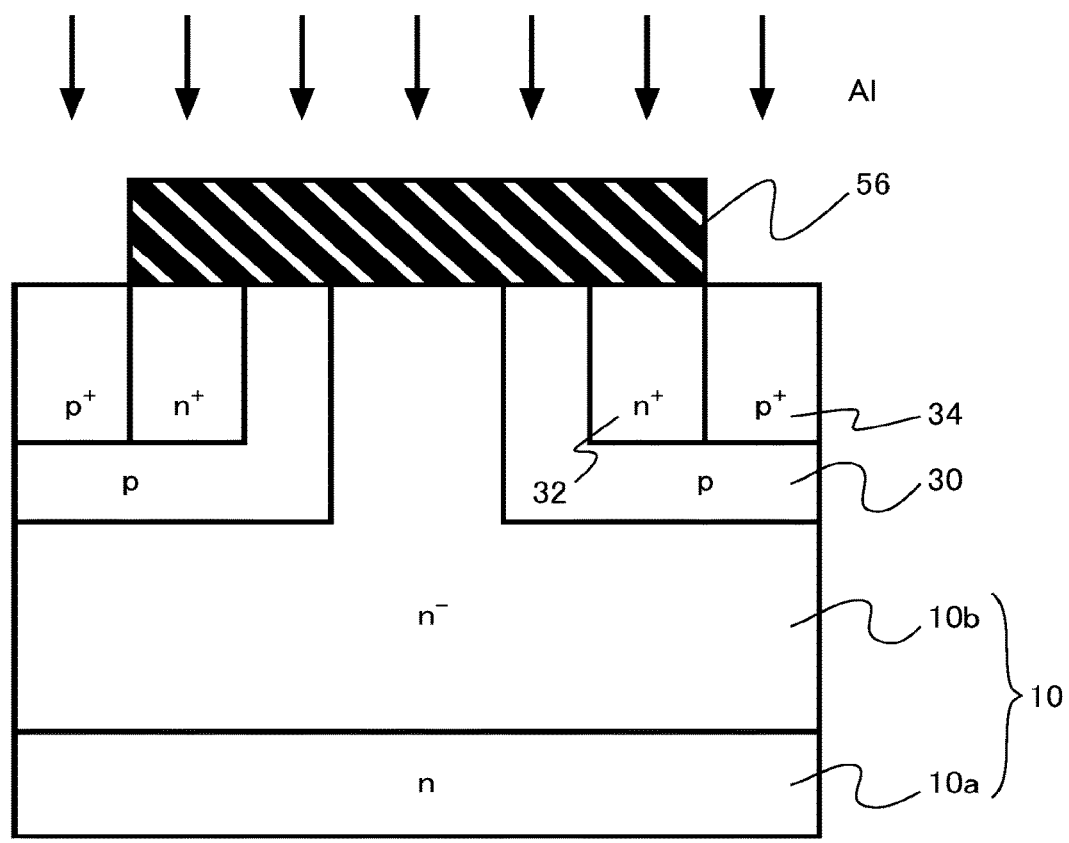
FIG. 22 is a schematic cross-sectional view of the semiconductor device being manufactured by the semiconductor device manufacturing method according to the third embodiment.

Patterning is then performed by photolithography and etching, to form a third mask material 56 made of SiO₂, for example. In step S306, Al as the p-type impurity is implanted into the drift layer 10b through ion implantation using the third mask material 56 as an ion implantation mask, to form the p-well contact regions (the p-type region) 34 (FIG. 22). This ion implantation is referred to as the second ion implantation. The concentration profile of the Al after the second ion implantation has the second projected range ($Rp_2$).

In step S308, annealing for activating the p-type impurity and the n-type impurity is performed. The activation annealing is performed in an inert gas atmosphere at a temperature not lower than 1700° C. and not higher than 1900° C., for example.

Figure 23:
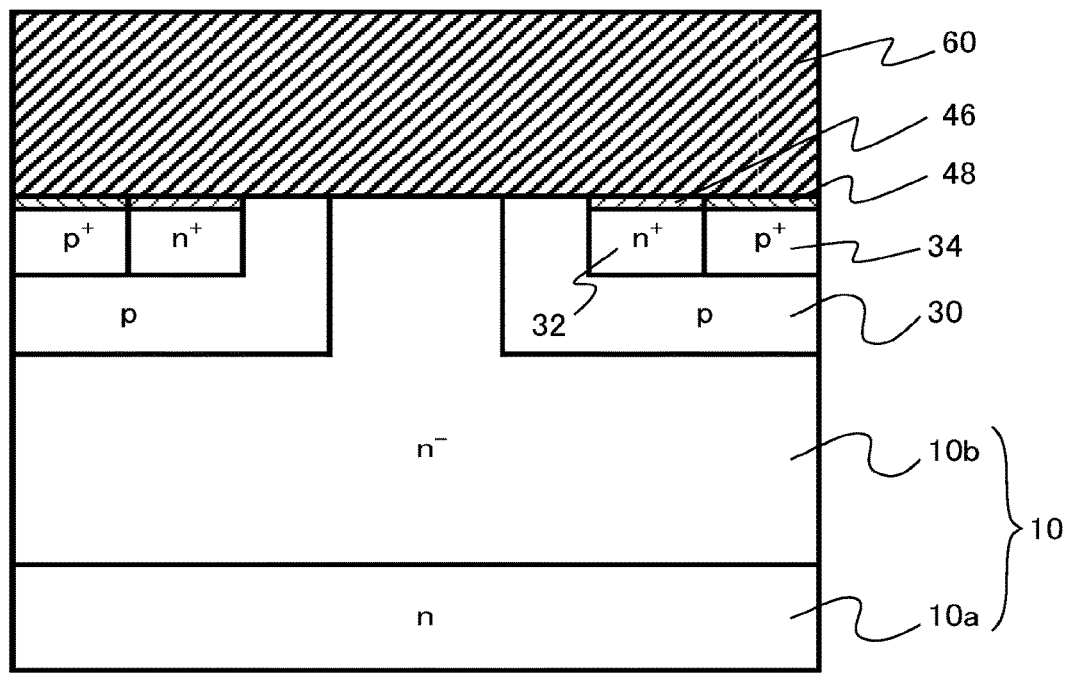
FIG. 23 is a schematic cross-sectional view of the semiconductor device being manufactured by the semiconductor device manufacturing method according to the third embodiment.

In step S308, the drift layer 10b is thermally oxidized, so that an oxide film 60 is formed (FIG. 23). The drift layer 10b is thermally oxidized to a deeper region than both of the first projected range ($Rp_1$) of the first ion implantation and the second projected range ($Rp_2$) of the second ion implantation, so that the oxide film 60 is formed.

The thermal oxidation is performed in an oxidizing atmosphere at a temperature not lower than 800° C. and not higher than 1500° C., for example. The temperature is preferably not lower than 900° C. and not higher than 1350° C. More preferably, the temperature is not lower than 1000° C. and not higher than 1300° C.

The thickness of the oxide film 60 to be formed depends on the projected ranges. In a case where a Si face is used as in this embodiment, the thickness of the oxide film 60 is preferably not smaller than 50 nm and not greater than 1000 nm, and more preferably, not smaller than 100 nm and not greater than 300 nm. If the thickness of the oxide film 60 is lower than the above range, the n-type impurity regions 46 and the p-type impurity regions 48 to be formed later might not become regions with a sufficiently high impurity concentration. If the thickness of the oxide film 60 exceeds the above range, the production time might become longer, and the production costs might become higher.

At the time of the formation of the thermally-oxidized film 60, the n-type impurity piles up and is segregated at a high concentration in the interfaces between the oxide film 60 and the source regions (the n-type region) 32, to form the n-type impurity regions (the first region) 46. Also, the p-type impurity piles up and is segregated at a high concentration in the interface between the oxide film 60 and the p-well contact regions (the p-type region) 34, to form the p-type impurity regions (the second region) 48.

Figure 24:
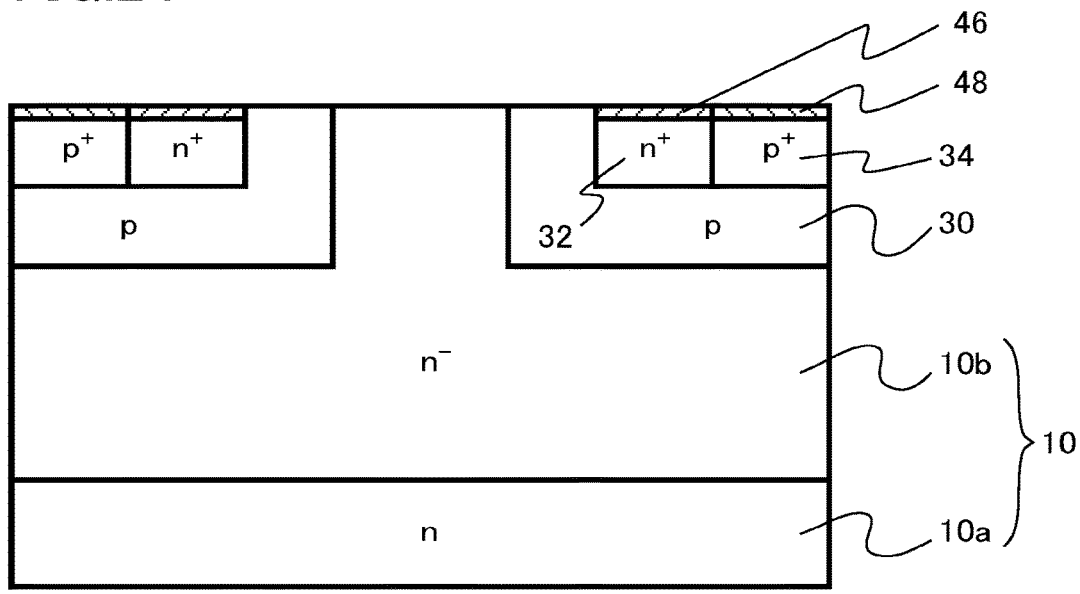
FIG. 24 is a schematic cross-sectional view of the semiconductor device being manufactured by the semiconductor device manufacturing method according to the third embodiment.

In step S312, the oxide film 60 is removed (FIG. 24). For example, the oxide film 60 is removed by hydrofluoric-acid wet etching.

Figure 25:
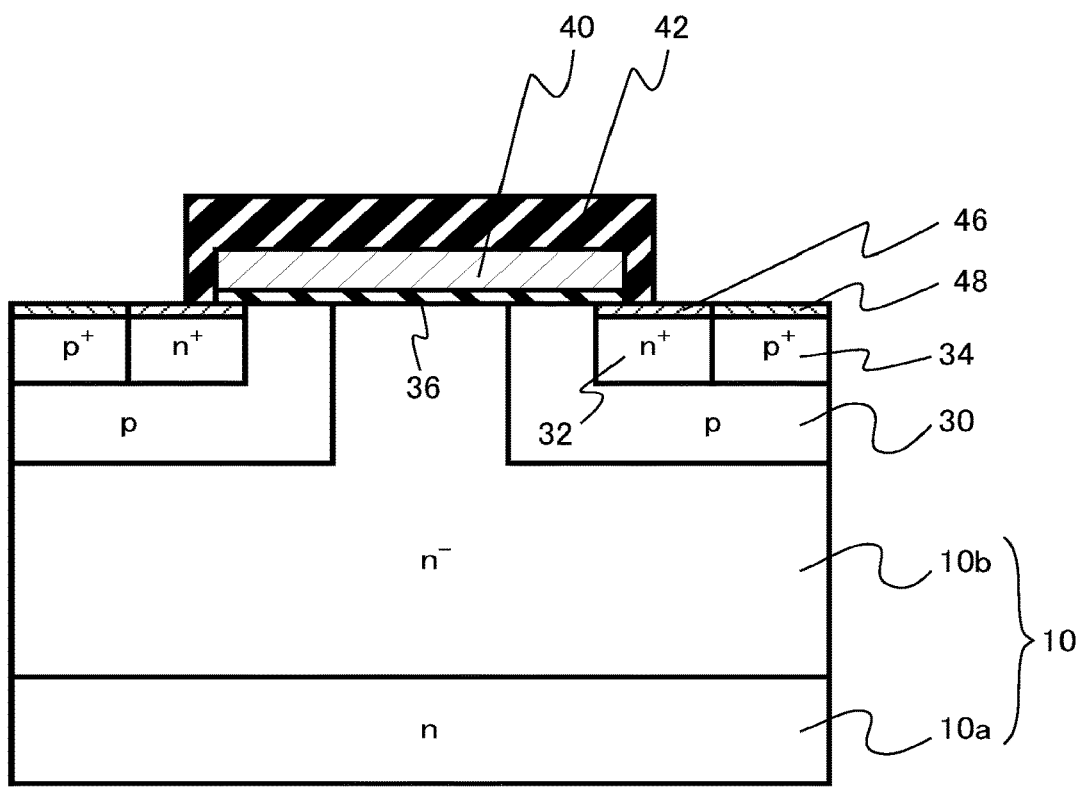
FIG. 25 is a schematic cross-sectional view of the semiconductor device being manufactured by the semiconductor device manufacturing method according to the third embodiment.

In step S314, the gate insulating film 36 that is a silicon oxide film, for example, is formed by CVD (Chemical Vapor Deposition) or thermal oxidation. In step S316, the gate electrode 40 made polycrystalline silicon, for example, is formed on the gate insulating film 36. In step S318, the interlayer insulating film 42 that is a silicon oxide film, for example, is formed on the gate electrode 40 (FIG. 25).

In step S320, the conductive source/p-well common electrode 44 to be electrically connected to the source regions 32 and the p-well contact regions 34 is formed. The source/p-well common electrode 44 is formed by TiN and Al sputtering, for example.

In step S322, the conductive drain electrode 50 is formed on the second surface side of the SiC substrate 10. The drain electrode 50 is formed by Ni sputtering, for example.

In step S324, annealing at a low temperature is performed to lower the contact resistance, particularly, of the drain electrode 50. The annealing is performed in an argon gas atmosphere at 400° C., for example.

By the above described manufacturing method, the MOSFET 300 shown in FIG. 17 is formed.

As described above, the concentration and the activation rate of an impurity in a SiC layer are normally low. Therefore, it is difficult to lower the contact resistance of a contact electrode with respect to a SiC layer. It is also difficult to forma common contact electrode for an n-type SiC region and a p-type SiC region that have different Fermi levels from each other.

In the MOSFET 300 according to this embodiment, the n-type impurity regions 46 in which an activated n-type impurity is segregated at a high concentration are provided between the source/p-well common electrode 44 and the source regions 32. The p-type impurity regions 48 in which an activated p-type impurity is segregated at a high concentration are also provided between the source/p-well common electrode 44 and the p-well contact regions (the p-type region) 34.

Accordingly, the barrier width becomes narrower by virtue of the same function as that described in the first and second embodiments, and the source/p-well common electrode 44 serving as a low-resistance ohmic contact for both the n-type source regions 32 and the p-type p-well contact regions 34 is realized. Thus, the high-performance MOSFET 300 is realized by a simple manufacturing method.

As described so far, according to this embodiment, the MOSFET 300 with a low contact resistance is realized.

Fourth Embodiment

A semiconductor device according to this embodiment differs from any of the first through third embodiments in being a transparent diode. In the description below, explanation of the same aspects of those of the first through third embodiments will not be repeated.

Figure 26:
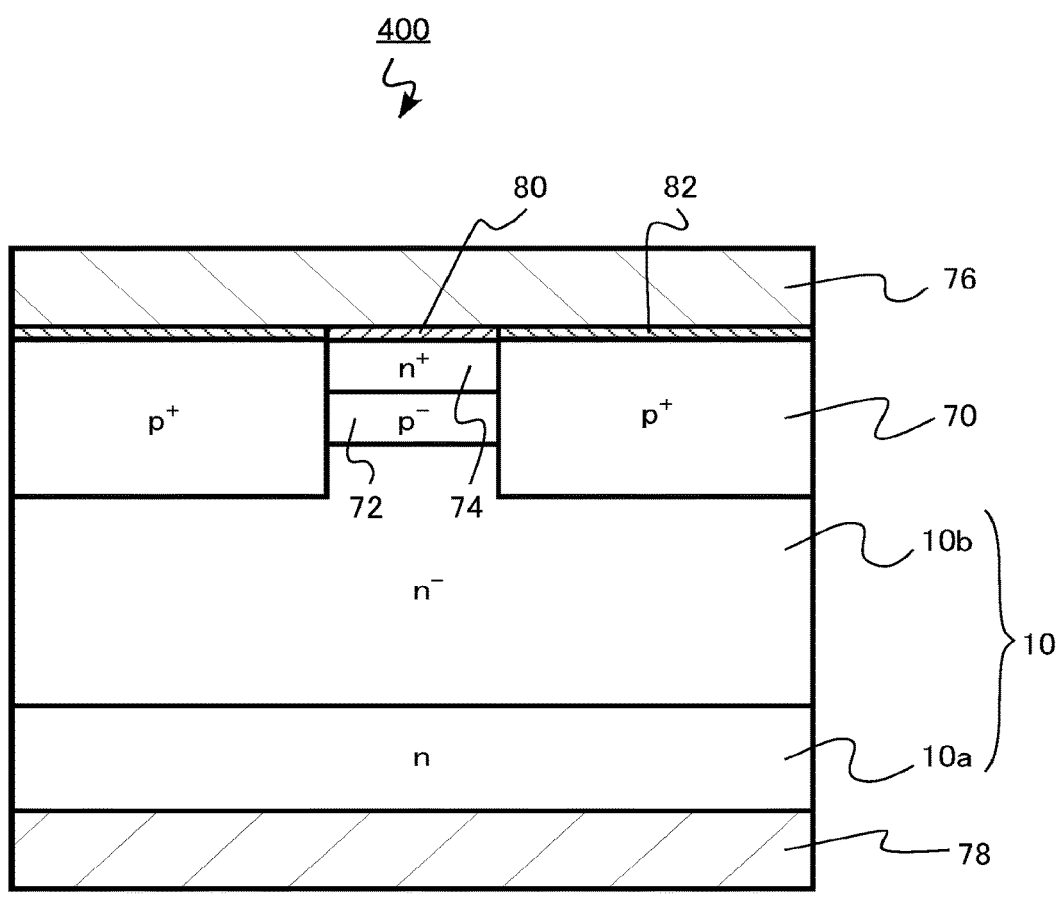
FIG. 26 is a schematic cross-sectional view of a semiconductor device according to a fourth embodiment.

FIG. 26 is a schematic cross-sectional view of the structure of a transparent diode that is a semiconductor device according to this embodiment.

This transparent diode 400 includes a SiC substrate 10 and p$^+$-type SiC layers (the p-type region) 70. The SiC substrate 10 is formed with an n-type SiC layer 10a and an n$^−$-type drift layer 10b on the SiC layer 10a.

In the region between the p$^+$-type SiC layers 70, a p$^−$-type SiC layer 72 and an n$^+$-type SiC layer (the n-type region) 74 are formed on the drift layer 10b.

An anode electrode 76 is provided over the n$^1$-type SiC layer (the n-type region) 74 and the p$^+$-type SiC layers (the p-type region) 70. The n$^+$-type SiC layer (the n-type region) 74, the p$^+$-type SiC layers (the p-type region) 70, and the anode electrode 76 are electrically connected.

The anode electrode 76 is made of a metal, for example. The metal forming the anode electrode 76 is TiN (titanium nitride), for example. Another metal such as Al (aluminum) may be stacked on the TiN. Other than a metal, it is possible to employ an electrically-conductive material such as polycrystalline silicon containing an n-type impurity.

An n-type impurity region (the first region) 80 containing an n-type impurity is provided between the n$^+$-type SiC layer (the n-type region) 74 and the anode electrode 76. P-type impurity regions (the second region) 82 containing a p-type impurity are provided between the p$^+$-type SiC layers (the p-type region) 70 and the anode electrode 76.

In the n-type impurity region 80, the highest concentration of the n-type impurity is not lower than $1\times10^{20}$ cm$^{-3}$ and not higher than $5\times10^{22}$ cm$^{-3}$. The n-type impurity is segregated at a high concentration in the interface between the n$^+$-type SiC layer (the n-type region) 74 and the anode electrode 76. The n-type impurity is N (nitrogen), for example. Alternatively, the n-type impurity may be As (arsenic), P (phosphorus), or Sb (antimony).

The distance between the first position where the n-type impurity is highest and the second position where the concentration of the n-type impurity becomes one digit lower than the highest concentration of the n-type impurity on the side of the n$^+$-type SiC layer (the n-type region) 74 is 50 nm or shorter. This distance is preferably 20 nm or shorter, and more preferably, 10 nm or shorter.

In the p-type impurity regions 82, the highest concentration of the p-type impurity is not lower than $1\times10^{20}$ cm$^{-3}$ and not higher than $5\times10^{22}$ cm$^{-3}$. The p-type impurity is segregated at a high concentration in the interfaces between the p$^+$-type SiC layers (the p-type region) 70 and the anode electrode 76. The p-type impurity is Al (aluminum), for example. Alternatively, the p-type impurity may be B (boron), Ga (gallium), or In (indium).

The distance between the first position where the p-type impurity is highest and the second position where the concentration of the p-type impurity becomes one digit lower than the highest concentration of the p-type impurity on the sides of the p$^+$-type SiC layers (the p-type region) 70 is 50 nm or shorter. This distance is preferably 20 nm or shorter, and more preferably, 10 nm or shorter.

A conductive cathode electrode 78 is formed on the second plane side of the SiC substrate 10. The cathode electrode 78 is made of Ni (nickel), for example.

The n-type impurity region 80 and the p-type impurity regions 82 can be formed in the same manner as in the third embodiment.

According to this embodiment, the anode electrode 76 serving as a low-resistance ohmic contact for both the n$^+$-type SiC layer (the n-type region) 74 and the p$^+$-type SiC layers (the p-type region) 70 is realized. Also, the n$^+$-type SiC layer (the n-type region) 74 can be easily made thinner. Accordingly, the high-performance transparent diode 400 is realized by a simple manufacturing method.

Although silicon carbide crystalline structures are 4H—SiC in the above described embodiments, the embodiments can also be applied to silicon carbides having other crystalline structures such as 6H—SiC and 3C—SiC. Also, in the above described embodiments, a contact electrode is formed on a Si face or a C face. However, the present disclosure can also be applied in cases where a contact electrode is formed on an A face, an M face, or an intermediate face between those faces.

Although PIN diodes, a MOSFET, and a transparent diode have been described as examples of semiconductor devices in the above embodiments, the present disclosure can also be applied to an electrode formed on a SiC layer required to have a low-resistance ohmic contact in an IGBT (Insulated Gate Bipolar Transistor), a MPS (Merged PIN Schottky) diode, or the like.

Further, the transparent diode according to the fourth embodiment may be employed as an internal diode of the MOSFET according to the third embodiment.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a p-type SiC layer;
an electrode electrically connected to the SiC layer; and
a p-type impurity region provided between the SiC layer and the electrode, the impurity region including a p-type first point and a p-type second point, p-type impurity concentration being maximum at the first point in the impurity region, p-type impurity concentration at the first point being not lower than $1\times10^{20}$ cm$^{-3}$ and not higher than $5\times10^{22}$ cm$^{-3}$, p-type impurity concentration at the second point being one exponent digit lower than the p-type impurity concentration at the first point, the first point being in contact with the electrode, a first distance between the first point and the second point being 20 nm or shorter, and a second distance between the electrode and the second point being 20 nm or shorter.

2. The device according to claim 1, wherein the p-type impurity is one of Al (aluminum), B (boron), Ga (gallium), and In (indium).

3. The device according to claim 1, wherein the electrode is a metal.

4. The device according to claim 3, wherein a carbon concentration in the metal is $1\times10^{18}$ cm$^{-3}$ or lower.

5. The device according to claim 1, wherein the first distance and the second distance is 10 nm or shorter.

6. The device according to claim 1, wherein concentration of p-type impurity between the first point and the second point decreases monotonically.

7. A semiconductor device comprising:
a n-type SiC layer;
an electrode electrically connected to the SiC layer; and
a n-type impurity region provided between the SiC layer and the electrode, the impurity region including a n-type first point and a n-type second point, n-type impurity concentration being maximum at the first point in the impurity region, n-type impurity concentration at the first point being not lower than $1\times10^{20}$ cm$^3$ and not higher than $5\times10^{22}$ cm$^{-3}$, n-type impurity concentration at the second point having concentration of n-type impurity one exponent digit lower than the n-type impurity concentration at the first point, the first point being in contact with the electrode, a first distance between the first point and the second point being 20 nm or shorter, and a second distance between the electrode and the second point being 20 nm or shorter.

8. The device according to claim 7, wherein the n-type impurity is one of N (nitrogen), P (phosphorous), As (arsenic), and Sb (antimony).

9. The device according to claim 7, wherein concentration of n-type impurity between the first point and the second point decreases monotonically.

10. A semiconductor device comprising:
a p-type first SiC layer;
an n-type second SiC layer;
an electrode electrically connected to the first SiC layer and the second SiC layer;
a p-type first impurity region provided between the first SiC layer and the electrode, the first impurity region including a p-type first point and a p-type second point, p-type impurity concentration being maximum at the p-type first point in the first impurity region, p-type impurity concentration at the p-type first point being not lower than $1\times10^{20}$ cm$^{-3}$ and not higher than $5\times10^{22}$ cm$^{-3}$, the p-type second point having concentration of p-type impurity one exponent digit lower than the p-type impurity concentration at the p-type first point, the p-type first point being in contact with the electrode, a distance between the p-type first point and the p-type second point being 20 nm or shorter, and a distance between the electrode and the p-type second point being 20 nm or shorter; and
a n-type second impurity region provided between the second SiC layer and the electrode, the second impurity region including a n-type first point and a n-type second point, n-type impurity concentration being maximum at the n-type first point in the second impurity region, n-type impurity concentration at the n-type first point being not lower than $1\times10^{20}$ cm$^{-3}$ and not higher than $5\times10^{22}$ cm$^3$, the n-type second point having concentration of n-type impurity one exponent digit lower than the n-type impurity concentration at the n-type first point, the n-type first point being in contact with the electrode, a distance between the n-type first point and the n-type second point being 50 nm or shorter, and a distance between the electrode and the n-type second point being 50 nm or shorter.

11. The device according to claim 10, wherein concentration of p-type impurity between the p-type first point and the p-type second point, and a concentration of n-type impurity between the n-type first point and the n-type second point decreases monotonically.

* * * * *